US006873946B1

(12) United States Patent
Robinson

(10) Patent No.: US 6,873,946 B1
(45) Date of Patent: Mar. 29, 2005

(54) ZEUS CODE TOOL A METHOD FOR IMPLEMENTING SAME AND STORAGE MEDIUM STORING COMPUTER READABLE INSTRUCTIONS FOR INSTANTIATING THE ZEUS CODE TOOL

(75) Inventor: David F. Robinson, Fredericksburg, VA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/451,718

(22) Filed: Dec. 1, 1999

(51) Int. Cl.[7] ................................................ G06G 7/48
(52) U.S. Cl. ...................... 703/8; 703/2; 703/6; 703/7; 702/100; 702/140
(58) Field of Search ............................ 703/8, 9, 7, 10; 345/473

(56) References Cited

U.S. PATENT DOCUMENTS

| | | | |
|---|---|---|---|
| 5,537,641 A | | 7/1996 | da Vitoria Lobo et al. .. 395/119 |
| 5,557,773 A | | 9/1996 | Wang et al. ................. 395/500 |
| 5,586,052 A | | 12/1996 | Iannuzzi et al. ............. 364/512 |
| 5,649,064 A | | 7/1997 | Jorgensen et al. ............. 395/22 |
| 5,801,969 A | * | 9/1998 | Nagahama ....................... 703/9 |
| 5,812,431 A | | 9/1998 | Kundert ....................... 364/578 |
| 5,838,588 A | * | 11/1998 | Santoso et al. ............. 700/287 |
| 5,841,967 A | | 11/1998 | Sample et al. ......... 395/183.09 |
| 5,859,785 A | | 1/1999 | Kundert ....................... 364/578 |
| 5,877,777 A | * | 3/1999 | Colwell ....................... 345/473 |
| 5,910,902 A | * | 6/1999 | Molvig et al. ................. 702/47 |
| 5,926,399 A | * | 7/1999 | Berkooz et al. ................. 703/7 |
| 6,038,389 A | * | 3/2000 | Rahon et al. ................. 703/10 |
| 6,088,521 A | * | 7/2000 | Strumolo et al. ............... 703/8 |
| 6,266,071 B1 | * | 7/2001 | Stam et al. .................. 345/473 |
| 6,285,968 B1 | * | 9/2001 | Motoyama et al. ............. 703/1 |
| 6,654,710 B1 | * | 11/2003 | Keller ............................. 703/9 |
| 2003/0139915 A1 | * | 7/2003 | Shima et al. ................... 703/8 |

OTHER PUBLICATIONS

"Zeus User Manual 'Real Gas' Effects" A.B. Wardlaw, May 6, 1991, NAVSWC–TR–91–86.*
"Solution of the 3–D Euler Equations for the Flow About a Fighter Aircraft Configuration", D. Weissbein, ACM 0–89791–273–X/88/0007/1127, 1988.*
"Parallelizing Navier–Stokes Computations on a Variety of Architectural Platforms", D. Jayasimha, ACM 0–89791–985–8/97/001 1995.*
"PELLPACK: A Problem Solving Environment for PDE–Based Applications" E. Houstis, ACM Transactions on Math Software, vol. 24, No. 1, Mar. 1998.*
"TADS–A CFD–Based Turbomachinery Analysis and Design System with GUI", Version 2.0, M.J. Koiro, NASA/CR–1999–20660 Methods and Results, May 1999.*

(List continued on next page.)

Primary Examiner—Jean R. Homere
Assistant Examiner—Fred Ferris
(74) Attorney, Agent, or Firm—James B. Bechtel, Esq.; Matthew J. Bussan, Esq.; Scott R. Boalick, Esq.

(57) ABSTRACT

A method for presenting a graphic user interface (GUI) facilitating generation of selected ones of a Euler grid and a Navier-Stokes grid from a single set of predetermined parameters includes step for defining the geometry of a vehicle to be tested, defining the environment in which the vehicle is to tested, generating the selected ones of the Euler grid and the Navier-Stokes grid responsive the set of predetermined parameters generated in two defining steps, and post-processing the output of the generating step. Computer readable instructions for permitting a general purpose computer to instantiate a graphic user interface (GUI) generating selected ones of a Euler grid and a Navier-Stokes grid from a single set of predetermined parameters and a storage medium storing the computer readable instructions are also described.

19 Claims, 39 Drawing Sheets

OTHER PUBLICATIONS

"TADS–A CFD–Based Turbomachinery Analysis and Design System with GUI", Version 2.0, M.J. Koiro, NASA/CR–1999–20660 Users Manual, May 1999.*

"Development of Three–Dimensional DRAGON Grid Technology", Y. Zheng, NASA/TM–1999–209458, Nov. 1999.*

"Geometry Modeling and Grid Generation for Design and Optimization", J.A. Samareh, Workshop on Comutational Aerosciences in the $21^{st}$ Century, Apr. 1998.*

"Transonic Airfoil Design with Expert Systems", R.E Zores, White Paper—DLR German Aerospace Research, 1995.*

"Coupled Aeroelastic Analysis of a Free Flight Rocket", D.S. Livshits, IMI—Israel Military Industries, 1999.*

"Solution of the 3–D Euler Equations for the Flow About a Fighter Aicraft Configuration using a Hypercube Parallel Processor", D.A. Weissbein, ACM 0–89791–273–X/88/007/1127, 1998.*

PowerFLOW Specifications, Release 3, Exa Corporation, Jul. 1999.*

Wardlaw, A.B.; Davis, S.F.; and Priolo, F.J., A Second Order Gudonuv's Method for Supersonic Tactical Missile Computations (NSWC TR 86–506, Dec. 1998).

Hsieh, T. and Priolo, F.J., Generation of the Starting Plane Flowfield for Supersonic Flow Over a Spherically Capped Body (NSWC TR 84–484, May 1985).

Wardlaw, A.B. and Priolo, F.J., Applying the Zeus Code (NSWC TR–86–508, Dec. 1986).

Wardlaw, A.B. and Baltakis, F.P., "An Integral Boundary Layer Procedure for Tactical Missiles," (AIAA 92–1026, Aerospace Design Conference, Irvine, CA, Feb. 1992).

Wardlaw, A.B.; Priolo, F.J.; and Solomon, J.M., A Multiple Zone Method for Supersonic Tactical Missiles( NSWC TR 85–484, Jun. 1986).

Hymer, T.C.; Moore, F.G.; and Downs, C., User's Guide for an Interactive Personal Computer Interface for the Aeroprediction Code, NSWC–DD TR 94–107, Jun. 1994.

Baltakis, F.P., Wardlaw, A.B., and Allen, J.M., "Leeside Crossflow Modeling in Euler Space Marching Computations," (NSTC TR 86–342, Nov. 1986).

Kwong, C.M. and Myring, D.F., "Fusiform Body Separation Flow Field Calculations using Euler and Boundary Layer Methods" (Royal Aeronautics Society Conference on the Prediction and Exploitation of Separated Flows, Paper No. 27, Apr. 1989).

Wardlaw, A.B. and Baltakis, F.P., "An Integral Boundary Layer Procedure for Tactical Missiles" (AIAA 92–1026, Aerospace Design Conference, Irvine, CA, Feb. 1992).

Moore, F.G. and Hymer, T. Improved Empirical Model for Base Drag Prediction on Missile Configurations Based on New Wind Tunnel Data, (NSWC–DD TR 92–509, Oct. 1992).

* cited by examiner

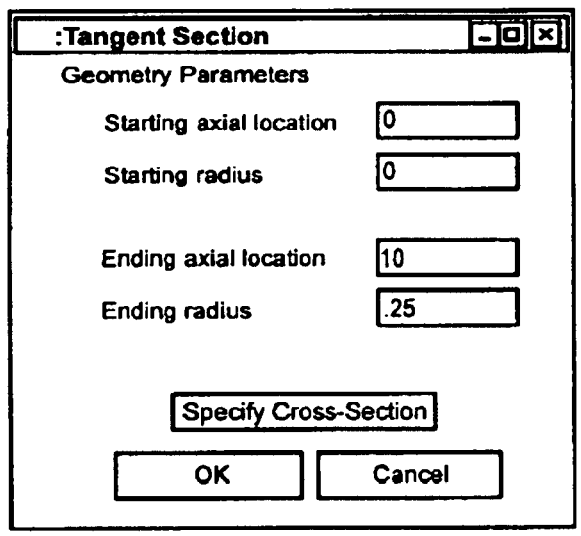
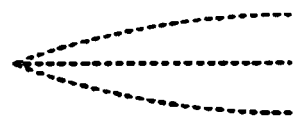
TANGENT OGIVE
$$r = \sqrt{p^2 + (z-L)^2} + (R-p)$$
$$p = \frac{R^2 + L^2}{2R}$$
FIG. 5b

SECANT OGIVE $$r = \sqrt{\rho^2 + (z-h)^2} + k$$

$$h = \rho \cos \alpha$$

$$k = \rho \sin \alpha$$

$$\alpha = \gamma - \theta$$

$$\theta = \tan^{-1}\left(\frac{R}{L}\right)$$

$$\gamma = \cos^{-1}\left(\frac{L^2 + R^2}{2\rho}\right)$$

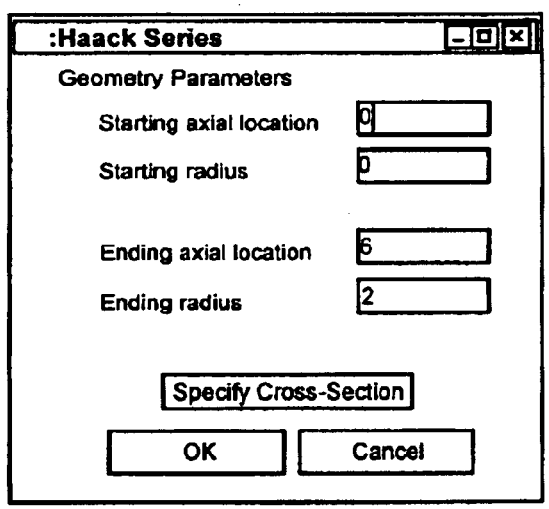
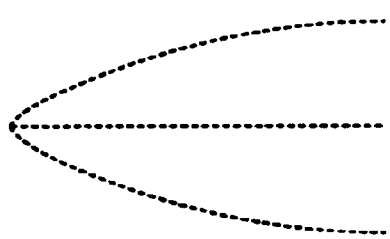
HAACK SERIES
$$\bar{r} = \sqrt{\frac{\left(\phi - \frac{\sin(2\phi)}{2} + C\sin^3\phi\right)}{\pi}}$$
$$\phi = \cos^{-1}(1 - 2\bar{z})$$
$$C = \frac{1}{3}$$
$$\bar{r} = \frac{r}{R}, \bar{z} = \frac{z}{L}$$
FIG. 5e

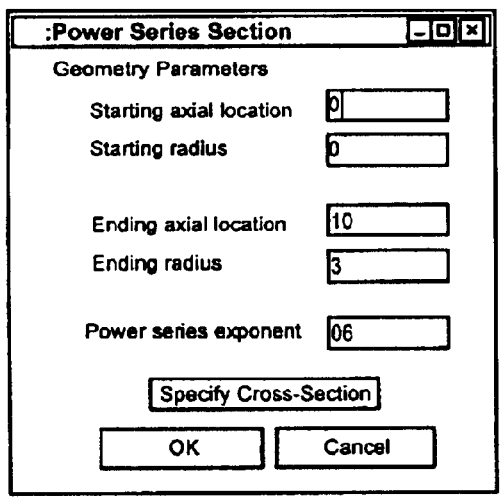
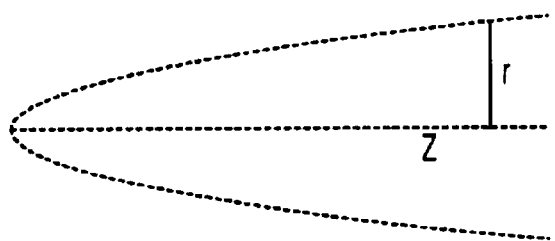
POWER SERIES
$r = z^n$
NOTE: THIS DOES NOT AGREE WITH THE TEXT!
FIG. 5f :Control Surface Definition (Plane #1 of 2)

Enter a cross-sectional plane of the control surface. These points are given with respect to the hinge line (i.e. z-0 is the axial location of the hinge line)

'X' points    00220222500

'Y' points    .01524 .01524 .01524

'Z' points    -.0420 0.0 .032

(Use spaces between points)

[ Next Plane ]   [ Delete Plane ]   [ Finished ]

FIG. 10

:NACA 4-Digit Airfoil Control Surface

| Enter the number of points used to describe the airfoil | | |
|---|---|---|
| Enter the maximum thickness (t/c) | | [% chord] |
| Enter the leading edge sweep angle | 45 | [deg] |
| Enter the span (root to tip distance) | 3.5 | |
| Enter the root chord | 2.0 | |
| Enter the tip chord | 5 | |
| Normalized distance from leading edge to hinge line (h/c) | 0 | |

OK   Cancel

Convert to 'User Specified Geometry'

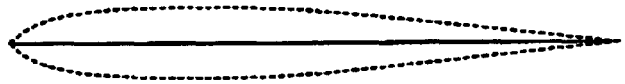

NACA 0012 SYMMETRIC AIRFOIL $$\bar{r} = t\left(a_0 \bar{z}^{0.5} - a_1 \bar{z} - a_2 \bar{z}^2 + a_3 \bar{z}^3 - a_4 \bar{z}^4\right)$$

$a_0 = 1.4845, \ a_1 = 0.6300$ $a_2 = 1.7580, \ a_3 = 1.4215$ $a_4 = 0.5075$ $$\bar{r} = \frac{r}{c}, \ \bar{z} = \frac{z}{c}$$

FIG. 12

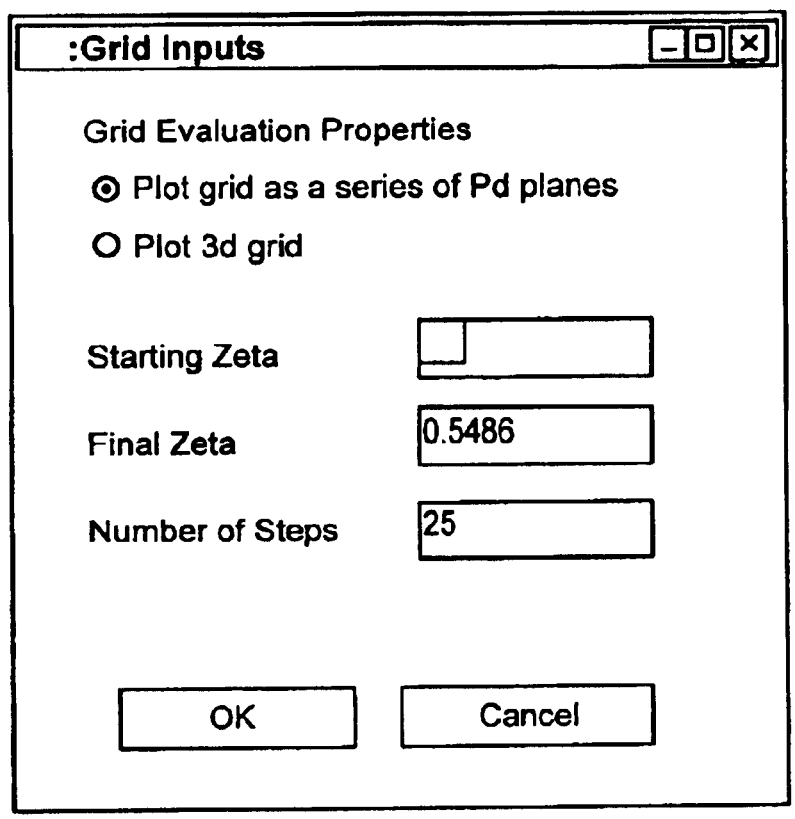
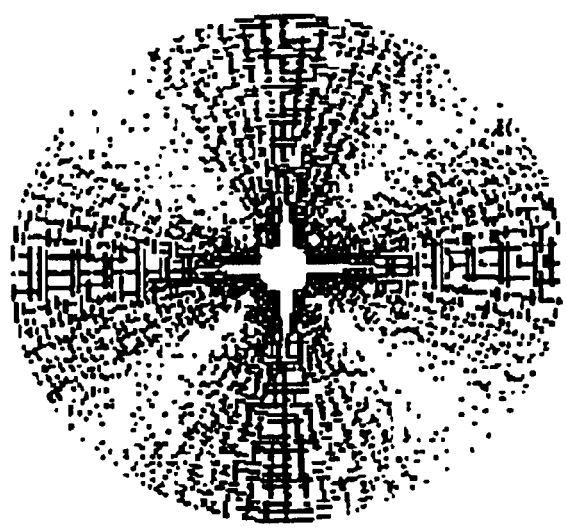
2d PLANE
FIG. 13

```
D:\Users\dfrobins\Zeus\Distribution>echo off
7 File(s) copied
7 File(s) copied
.
.
**** (Run0001) **** Free-Stream Starting Solution        ****
**** (Run0001) **** Executing ZEUS (Free-Stream Inflow Profile)****
.
.
STEP =  25   ZETA = 3.500E-02   DZETA = 1.000E-03   NCFL.MCFL =  1  18
STEP =  50   ZETA = 6.000E-02   DZETA = 1.000E-03   NCFL.MCFL =  1   6
STEP =  75   ZETA = 8.500E-02   DZETA = 1.000E-03   NCFL.MCFL =  1  19
NORMAL STOP
.
.
**** (Run0001) **** Run Completed ****
.
.
Press any key to continue . . ._
```

FIG. 25A

```
aC:\WINNT\System32\CMD.exe

D:\Users\dfrobins\Zeus\Distribution>echo off
7 File(s) copied
7 File(s) copied

**** (Run0001) **** Executing Boundary Layer Code (Adiabatic) ****
         Step =   100        Zeta =   6.4860E-02
         Step =   200        Zeta =   1.1972E-01
         Step =   300        Zeta =   1.7458E-01
         Step =   400        Zeta =   2.2944E-01
         Step =   500        Zeta =   2.8430E-01
         Step =   600        Zeta =   3.3916E-01
         Srep =   700        Zeta =   3.9402E-01
         Step =   800        Zeta =   4.4888E-01
         Step =   900        Zeta =   5.0374E-01

Normal Stop
```

FIG. 25B

| ZEUS ERROR MESSAGE | ZEUS ERROR MESSAGE TRANSLATION |
|---|---|
| 5101-5104 | MAXIMUM ITERATION COUNT TO LOCATE CORNER #1-#4 EXCEEDED |
| 5105-5106 | NEGATIVE PRESSURE ENCOUNTERED WHILE DECODING CONSERVATIVE VARIABLES |
| 5108 | UNDEFINED SURFACE GEOMETRY PARAMETER |
| 5109 | FORWARD SWEPT LEADING EDGES (CONTROL SURFACES) NOT YET IMPLEMENTED |
| 5110 | REARWARD SWEPT TRAILING EDGES (CONTROL SURFACES) NOT YET IMPLEMENTED |
| 5111-5112 | AFTER FIRST ORDER FIX THE FLOW REMAINS SUBSONIC |
| 5115-5116 | NEGATIVE SQUARE ROOT OCCURRED IN THE PRANDTL-MAYER EXPANSION CALCULATION |
| 5118 | ERROR IN LINEAR INTERPOLATION FOR SHOCKWAVE |
| 5120 | DIMENSIONS ARE TOO LARGE |
| 5121 | MAZ() ARRAY NOT CONSISTENT WITH MA() ARRAY |
| 5123 | SPECIFIED RADIAL CLUSTERING NOT ATTAINABLE FOR AFT GASP GRID |
| 5124 | UNDEFINED CONTROL SURFACE INPUT |
| 5128-5129 | CLUSTERING PARAMETERS NOT CONSISTENT BETWEEN THE CONE CODE AND THE ZEUS CODE |
| 5130 | ERROR IN OBLIQUE SHOCK CALCULATION |
| 5131 | NO POSSIBLE OBLIQUE SHOCK SOLUTION |
| 5132 | NO CONVERGENCE IN PRANDTL-MEYER CALCULATION |
| 5134 | THE NUMBER OF SPECIFIED AXIAL PLOTTING STATIONS IS GREATER THAN THE MAXIMUM ALLOWED. THE MAXPLOTS PARAMETER MUST BE INCREASED IN THE PARAMETER STATEMENT AND THE CODE MUST BE RECOMPILED |
| 5135 | INVALID STARTING SOLUTION PASSED TO THE EULER SOLVER. TYPICALLY CAUSED BY ERRORS IN THE CONE OR BLUNT BODY STARTING PROFILE GENERATORS |

FIG. 29a

| BOUNDARY LAYER ERROR MESSAGE | ERROR MESSAGE TRANSLATION |
|---|---|
| 6001 | MAXIMUM ITERATION COUNT REACHED |
| 6002 | INVALID AXIAL FORCE CALCULATION |

FIG. 29b

| CONE ERROR MESSAGE | ERROR MESSAGE TRANSLATION |
|---|---|
| 7001 | SHOCK ANGLE TOO GREAT. IF EXCESSIVE TURNING ANGLES ARE ENCOUNTERED DURING THE CONE SOLUTION, THEN THE INITIAL PROFILE WILL BE SUBSONIC. |

FIG. 29c

| BLUNT BODY ERROR MESSAGES | ERROR MESSAGE TRANSLATION |
|---|---|
| 8001 | ERRORS IN THE BLUNT BODY STARTING PROFILE GENERATOR. |

FIG. 29d

ZEUS CODE TOOL A METHOD FOR IMPLEMENTING SAME AND STORAGE MEDIUM STORING COMPUTER READABLE INSTRUCTIONS FOR INSTANTIATING THE ZEUS CODE TOOL

STATEMENT OF GOVERNMENT INTEREST

The invention described herein may be manufactured and used by or for the Government of the United States of America for governmental purposes without the payment of any royalties thereon or therefor.

CROSS REFERENCE TO APPENDICES

The present application includes a computer listing on microfiche Appendix attached hereto. The microfiche Appendix includes 839 frames disposed on 10 sheets. The computer listing in the microfiche Appendix details actual implementation of methods and apparatuses described herein. The computer listing is incorporated herein, in its entirety, by reference.

BACKGROUND OF THE INVENTION

The present invention relates generally to software tools for parametric studies with respect to missiles. More specifically, the present invention relates to a software tool which performs parametric studies using Euler and boundary layer solvers and which generates input data for conventional software analysis tools. Corresponding software and a storage medium for storing same are also disclosed.

During the past decade, significant advances have been made in the field of computational fluid dynamics (CFD). These include improvements in computational speed, numerical algorithm efficiency, and modeling (turbulence and combustion). Because of this progress, it is now commonplace to see accurate CFD solutions to very complex, large scale, three-dimensional flowfields. It should be noted, however, that a number of limitations remain. First, existing CFD solvers are quite complex and, thus, extensive training is required on the user's part prior to generating a solution. More specifically, the user must be trained not only in basic aerodynamics, but also in computational domain development and numerical methods. Second, the computational costs are still extensive. Complex problems or cases can still take days, weeks, or even months, of expensive workstation or supercomputer time to solve. Because of these limitations, parametric type design studies are often infeasible and, therefore, the use of CFD as an engineering design/development tool has been limited.

One software tool which has been adapted for use in problems amenable to CFD is the "ZEUS" flowfield solver, i.e., ZEUS code, which is a supersonic space marching Euler solver capable of computing both internal and external flowfields. The ZEUS algorithm was originally developed and described by Wardlaw et al. in documents such as:

(1) Wardlaw, A. B.; Davis, S. F.; and Priolo, F. J., A Second Order Gudonuv's Method for Supersonic Tactical Missile Computations (NSWC TR 86-506, December 1998);
(2) Hsieh, T. and Priolo, F. J., Generation of the Starting Plane Flowfield for Supersonic Flow Over a Spherically Capped Body (NSWC TR 84-484, May 1985);
(3) Wardlaw, A. B. and Priolo, F. J., Applying the Zeus Code (NSWC TR-86-508, December 1986);
(4) Wardlaw, A. B. and Baltakis, F. P., "An Integral Boundary Layer Procedure for Tactical Missiles," (AIAA 92-1026, Aerospace Design Conference, Irvine, Calif., February 1992); and
(5) Wardlaw, A. B.; Priolo, F. J.; and Solomon, J. M., A Multiple Zone Method For Supersonic Tactical Missiles(NSWC TR 85-484, June 1986).

It should be mentioned that all of the above-identified documents are incorporated herein by reference for all purposes.

While Zeus Code is applicable to a wide variety of problems, e.g., supersonic flight conditions, there are a number of limitations in the original code which make it difficult to implement on a routine basis, e.g., early in the design phase of a missile. The following difficulties are frequently encountered in the exemplary process of optimizing the design of a missile:

(1) For each geometry under consideration, the user must develop a Fortran source code that provides a geometric description of the missile surface. In addition, code that specifies the control surfaces and switching logic for the boundary conditions must be generated.
(2) The user must be familiar with a number of separate codes in order to implement a ZEUS run. These include a separate code for each of the following tasks:
   (a) Cone/Blunt—Generate an initial profile by running one of the two codes;
   (b) Convert—Convert the initial profile to a form readable by ZEUS;
   (c) ZEUS—Solves the Euler form of the equations of motion; and
   (d) BL—Performs a boundary layer analysis of the inviscid flowfield.
   It will be appreciated that since the user must understand all of the inputs/outputs from each of the above codes, this significantly increases the amount of training required.
(3) The setup time required before executing the code can be significant (typically on the order of hours/days). In addition, if parametric studies are desired, a separate set of input files must be generated for each case under consideration. This is both a time consuming and error prone process when a large number of cases are desired.
(4) Inherent limitations (space marching) in the ZEUS code prevent the solution of any flowfield with subsonic regions.

What is needed is a software tool that could significantly reduce both the costs and turnaround time associated with CFD solutions of missile type geometries with arbitrary control surfaces. More specifically, what is need is a software tool which would minimize the required training, reduce the setup/execution time, minimize the costs associated with obtaining computational fluid dynamic solutions, and extend the range of applications for the Zeus code.

SUMMARY OF THE INVENTION

Based on the above and foregoing, it can be appreciated that there presently exists a need in the art for a software tool and corresponding software which mitigates the above-described deficiencies. The present invention was motivated by a desire to overcome the drawbacks and shortcomings of the presently available technology, and thereby fulfill this need in the art. In particular, the present inventions was motivated by a desire to make the Zeus code more amenable to solving for the forces/moments on missile type geometries with arbitrary control surfaces.

The present invention is method and corresponding computer program which includes both a fluids solver, and a grid generator. More specifically, the inventive method and corresponding software program allows for generation of a Euler grid, which permits problem solution with the built in Zeus Euler solver and boundary layer solver, and a Navier-Stokes (NS) grid. Moreover, the Zeus$^{++}$ code exports the NS grid and all of the required input files necessary for use with a conventional computational fluid dynamics (CDF) solver.

One object of the present invention is to provide a grid generator with a point-and-click interface.

Another object of the present invention is to provide a grid generator with a point-and-click interface with a number of pre-defined missile geometries incorporated therein.

Still another object of the present invention is to provide a grid generator with a point-and-click interface wherein a variety of cross-sectional geometries can be applied, along with cross-section blending, e.g., blending a circular nose cone into an elliptic forebody.

Yet another object of the present is to provide a tool which advantageously can be run on a personal computer under Windows 95, 98 and NT.

An additional object of the present is to provide a tool which advantageously can be run on a personal computer under Windows 95, 98 and NT wherein the GUI permits significant reductions in the cost associated with performing CDF evaluations of various missile geometries.

A still further object of the present invention is to provide a tool which allows for multiple runs in order to simplify parametric type studies. According to one aspect of the invention, the user simply specifies the initial, final, and incremental parameter of interest, e.g., Mach number, angle of attack, yaw angle, roll angle, etc., and the tool runs all possible variants.

Another object of the present invention is to provide a tool which solves both the Euler equation, i.e., generates an inviscid solution using the Zeus code, and the viscous boundary layer equations. Preferably, the inviscid output from the Zeus code is used as a boundary condition to a viscous boundary layer solver, which allows for the computation of viscous effects, i.e., wall heating rates, turbulent effects, viscous drag, etc.

It will be appreciated that the present invention is not to be limited to systems and methods including one or more of the above-identified objects, i.e., none of the enumerated objects need actually be present in invention defined by the appended claims since only certain, and not all, objects of the invention have been specifically described above. Numerous other objects advantageously may be provided by the invention, as defined in the appended claims, without departing from the spirit and scope of the invention.

These and other objects, features and advantages according to the present invention are provided by a storage medium for storing computer readable instructions for permitting a general purpose computer to instantiate a graphic user interface (GUI) and generating selected ones of a Euler grid and a Navier-Stokes grid from a single set of predetermined parameters. According to one aspect of the invention, storage medium also contains computer readable instructions for instantiating at least one of a Euler solver and a boundary layer solver and for generating data files readable by a plotting package.

These and other objects, features and advantages according to the present invention are provided by computer readable instructions for converting a general purpose computer into a specialized computer presenting a graphic user interface (GUI) generating selected ones of a Euler grid and a Navier-Stokes grid from a single set of predetermined parameters. Preferably, the computer readable instructions include:

a first software module for defining the geometry of a vehicle to be tested;

a second software module for defining the environment in which the vehicle is to tested;

a third software module for generating the selected ones of the Euler grid and the Navier-Stokes grid; and a fourth software module for post-processing the output of the third software module.

These and other objects, features and advantages according to the present invention are provided by a method for presenting a graphic user interface (GUI) facilitating generation of selected ones of a Euler grid and a Navier-Stokes grid from a single set of predetermined parameters. Advantageously, the method includes step for:

(a) defining the geometry of a vehicle to be tested;

(b) defining the environment in which the vehicle is to tested;

(c) generating the selected ones of the Euler grid and the Navier-Stokes grid responsive the set of predetermined parameters generated in steps (a) and (b); and (d) post-processing the output of step (c).

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which:

FIG. 5a through 5g are screen captures of the data entry panels, corresponding geometric representations of nose and transition sections, and equation block employed in generating the corresponding section;

FIG. 10 is a screen capture of a Control Surface Definition data entry panel generated by the Zeus$^{++}$ code tool;

FIG. 12 is a screen capture of a NACA 4-Digit Airfoil Control Surface data entry panel generated by the Zeus$^{++}$ code tool;

FIG. 13 is a screen capture of the Euler Grid Inputs dialog box and corresponding two dimensional grid plane plot generated by the Zeus$^{++}$ code tool;

FIGS. 25a and 25b are screen captures of command prompts produced during execution of the Zeus++ code tool;

FIGS. 29a through 29d illustrate error codes which can be generated during execution of the Zeus++ code tool.

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
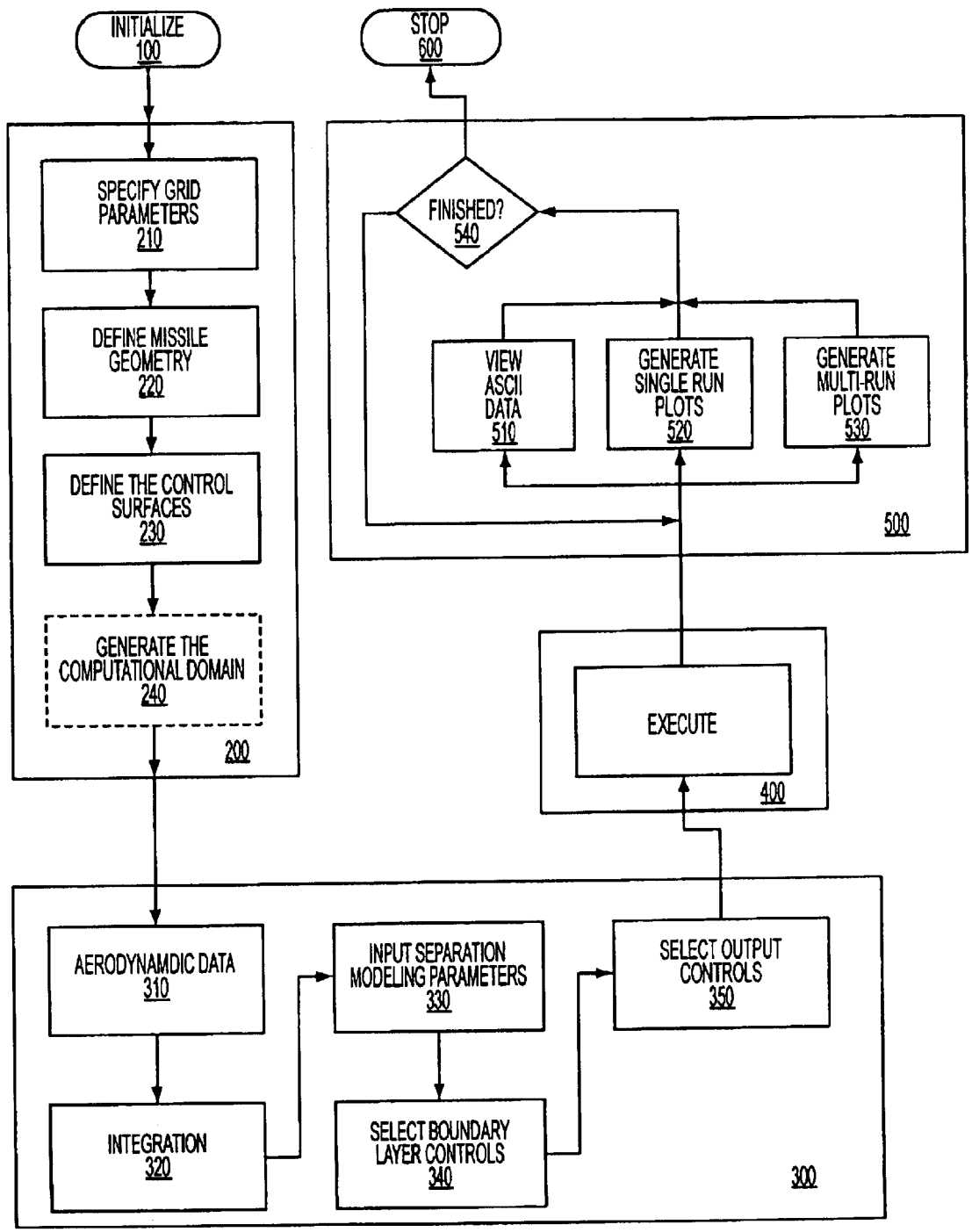
FIG. 1 is a high level flowchart of the routines and included subroutines of the Zeus$^{++}$ code tool according to the present invention.

FIG. 1 is a flowchart illustrating the Zeus++ code tool according to the present invention. As shown in FIG. 1, the Zeus++ code tool includes four routines, i.e., a geometry setup routine 200, a routine 300 for defining case information, an execution routine 400; and a post-processing routine 500. Each of the routines 200, 300, and 500 advantageously include subroutines, which will be discussed in greater detail below.

Figure 2:
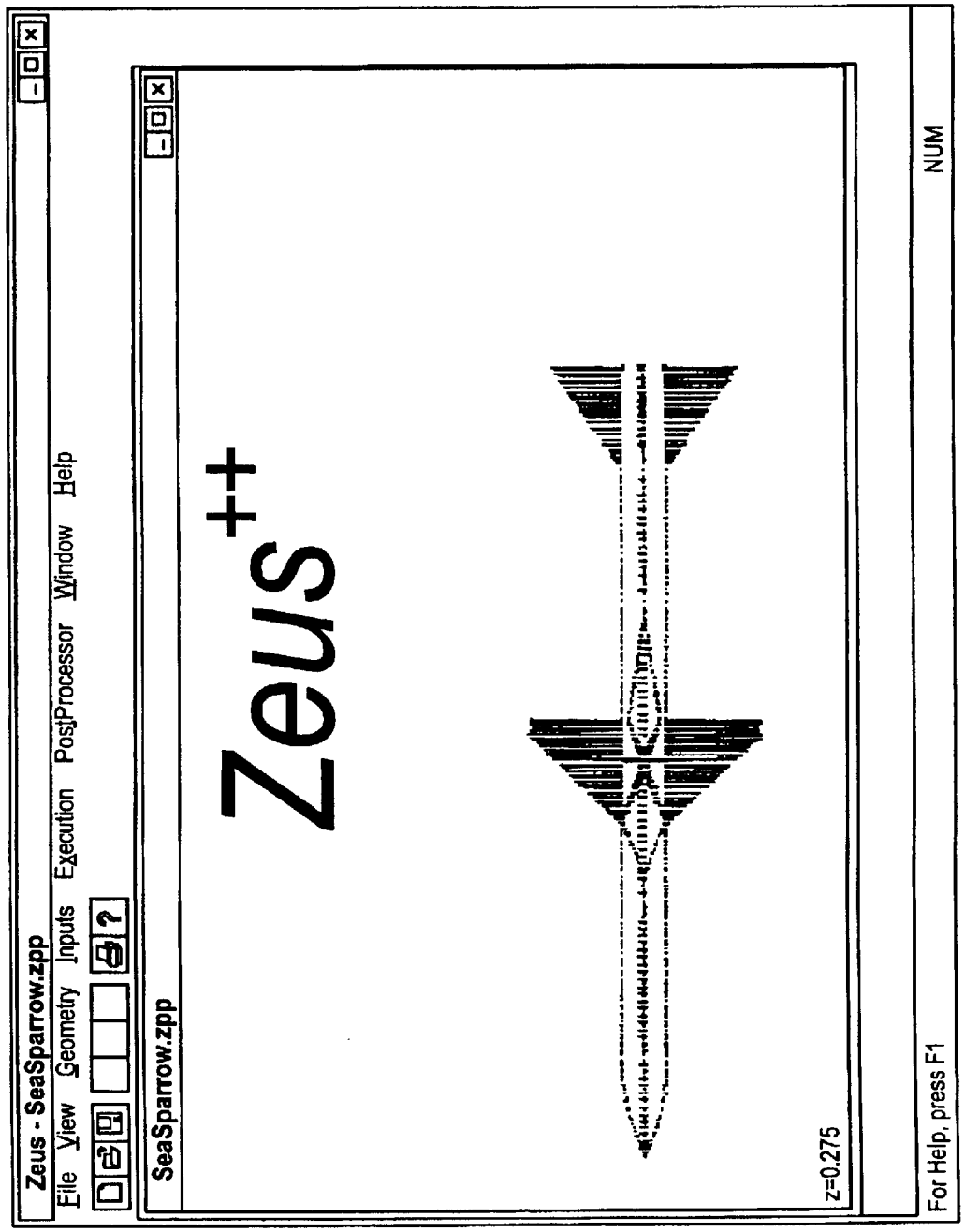
FIG. 2 is a screen capture the graphical user interface (GUI) instantiated by the Zeus$^{++}$ code tool.

Each of the routines 200, 300, 400, and 500 advantageously can be accessed from the graphical user interface (GUI) illustrated in FIG. 2, which advantageously is generated the Zeus++ code software running on a conventional personal computer or workstation (not shown). From inspection of FIG. 2, it will be appreciated that the GUI includes pull down menus labeled File, View, Geometry, Inputs, Execution, Post-Processor, Window, and Help. These pull down menus labeled Geometry, Inputs, Execution, and Post-Processor constitute means for accessing the routines 200, 300, 400, and 500. Each of the functions provided by the pull down menus are briefly described in Table I. The underlined labels will be discussed in greater detail following Table I.

TABLE I

| | |
|---|---|
| File | Controls file I/O and printing. |
| View | Toolbar views and runtime options. |
| Geometry Setup | Define the missile, control surface geometries, and computational domain. |
| Inputs | Input free-stream conditions, runtime parameters, reference conditions, etc. |
| Execution | Executing the code |
| Post-Processor | Post-Processing |
| Window | Layout and orientation of windows |
| Help | Help controls and 'About' information (author, version #, etc.) |

It should be mentioned at this point that the GUI provides two-dimensional sketches of the side and frontal views, which are displayed in the main view screen, as the geometry of the missile and its control surfaces are specified. The Zeus++ code tool provides a variety of methods for manipulating the sketch, each of which is listed in the upper left corner of the main view screen and which is discussed in detail below.

Ctrl-R Pressing the 'Control' and 'R' keys simultaneously will regenerate the geometry display shown in the main window. This should be done any time the missile geometry is modified and an updated view is desired. Note that this view is for display purposes only, and therefore, to limit computational effort, a low-resolution representation of the surface geometry is provided. This is not representative of the computational domain employed during the solution procedure. If desired, the resolution of the display can be increased/decreased by modifying the number of points in the View/Options section.

+/−Pressing the '+'and '−' keys steps the views circumferentially through each of the zone edges. '+'shows the next and '−' shows the previous circumferential view.

n/p Pressing the 'n' and 'p' keys steps the front view axially down the missile. 'n' and 'p' go to the next and previous axial location, respectively. Pressing 'N' or 'P' has the same effect, however, larger axial steps are taken. The current axial location is shown in the lower left corner of the main view screen (z=0.275).

A/a Pressing the 'A' or 'a' key redraws all of the axial stations and circumferential planes.

Ctrl-B Pressing the 'Control' and 'B' keys simultaneously will display the axial stations where the inviscid grid was output. These stations are shown as blue tic marks along the centerline of the missile geometry. This feature cannot be employed until after an inviscid run has been completed.

Z/z Pressing the 'z' or 'Z' keys zooms in/out on the main view screen. The amount of scaling applied to the original sketch is shown in the upper right hand corner. To return to the original settings, press Ctrl-R to regenerate the sketch.

Arrow keys The arrow keys are used to translate the sketches in the main window.

It should be noted that the viscous boundary layer solver requires the inviscid Euler solution as a boundary condition. Therefore, the inviscid solution must be performed before running the viscous code. In other words, the Ctrl-B command cannot be employed until after an inviscid run has been completed. To obtain an accurate viscous approximation, an adequate number of inviscid profiles must be provided such that all relevant geometric features are spatially resolved. The inviscid profiles are written out at the user-specified intervals, as discussed in greater detail below with respect to boundary layer inputs.

Figure 3:
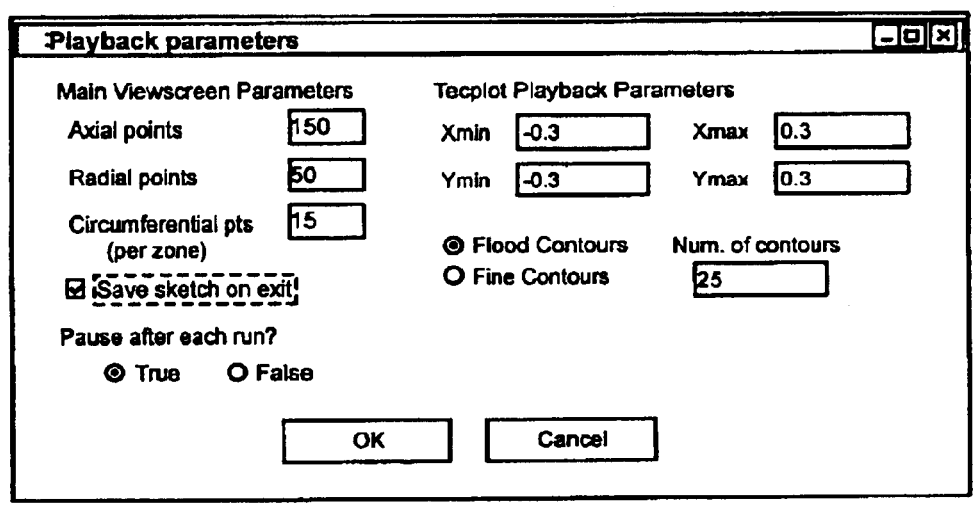
FIG. 3 is a screen capture of the Playback Parameters panel generated by the Zeus$^{++}$ code tool.

It should also be mentioned that selected global parameters for the Zeus$^{++}$ code tool advantageously can be accessed via the "View" pull down menu. When the subheading for Playback Parameters is selected by the user, the dialog box illustrated in FIG. 3 is generated. This dialog box permits the user to customize the following program options:

Number of Points—The sketch shown in the main window is a low-resolution representation of the current missile geometry. To increase/decrease the resolution of the geometric display simply increase/decrease the appropriate points parameter (axial, radial, or circumferential). Increasing the resolution will increase both the time to display the sketch as well as the size of the output data file (*.zpp).

Save Sketch—The output data file for the Zeus$^{++}$ code (*.zpp) contains all of the input parameters as well as the coordinates for the geometry sketch shown in the main window. To minimize the size of the output files (*.zpp) de-select the 'save sketch on exit' dialog box shown above. This will significantly decrease the size of the output file (approximately 3 k vs. 1–2 meg.), however, when the case is restarted, the geometry sketch must be regenerated. If the size of the output file is not important then it is recommended that this option be selected to minimize the computational effort required at startup.

Tecplot Parameters—A number of Tecplot macro files (contour plots, movie files, etc.) are generated by the Zeus$^{++}$ code in order to simplify post-processing. It should also be mentioned that Tecplot is a commercial plotting software package produced by Amtec Engineering, Inc. The following parameters, used in the macro files, are specified in the View/Options section:

$X_{min}$, $X_{max}$—The minimum/maximum x-axis range for the movie files.

$Y_{min}$, $Y_{max}$—The minimum/maximum y-axis range for the movie files.

Flood/Line—Specify either flood or line drawing for the contour plots.

# of contours—Specify the number of contour lines to be drawn.

Pause—Zeus$^{++}$ runs a number of external programs from the command prompt. If the 'Pause after each run' feature is selected then the command prompt will remain active (i.e., paused) and prompt the user to 'press any key' before exiting. If the pause feature is false, the Zeus$^{++}$ code will automatically close the command prompt upon termination of the code.

Referring again to FIG. 1, the Zeus$^{++}$ code tool is executed at step 100 by, in an exemplary case, double clicking on the program 'ZeusPP.exe', entering a name for the current case, e.g., SeaSparrow, and then clicking on 'Start New Case'. This will initialize the program and generated the GUI illustrated in FIG. 2. It will be noted that SeaSparrow missile illustrated in FIG. 2 was chosen because this missile includes both dorsal and tailfins and, thus, illustrates several features discussed in greater detail below.

The geometry setup routine 200 will now described in terms of its subroutines, which include a subroutine 210 for specify the grid parameters, a subroutine 220 in which the selected missile geometry is defined, a subroutine 230 in which any control surfaces are defined, and an optional subroutine 240 in which the computational domain is generated. It will be appreciated that the properties that define the computational grid are specified in routine 200; each of these parameters is described in detail immediately below. Moreover, each of these subroutines will be described in terms of the parameters that are input to the Zeus$^{++}$ code during the subroutine; the various dialog boxes that are generated will also be depicted when appropriate.

During subroutine 210, the user clicks on 'Geometry,' selects 'Grid Parameters' and then selects 'Euler Grid Properties'. It will be appreciated that in the 'Grid Parameters' option, it is possible to select from either of two sets of grid parameters. In the first (Euler Grid Properties), the parameters specified are applied during both the Zeus Euler solution and the viscous boundary layer solution. In the second (Navier Stokes (N-S)Grid Properties), the parameters specified are used to generate a grid, which can be exported to a full Navier-Stokes computational fluid dynamics solver, which is a separate software program, i.e., not part of the present invention. Stated another way, the Navier-Stokes grid parameters are used only for grid generation purposes and, therefore, can be omitted if the user does not intend to export the grid to a N-S solver.

More specifically, the Zeus$^{++}$ tool has two primary functions. The code serves not only as an approximate flow solver, but also as a Navier-Stokes grid generator. Therefore, two separate sets of grid parameters are specified when setting up the geometry. In the first, the user inputs the parameters that will be used during the Euler and boundary layer solutions of the flowfield (subroutine 210). In the second, the input parameters are used to generate the Navier-Stokes grid and appropriate boundary conditions, as discussed below with respect to subroutine 240. The grip parameters specified in subroutine 210 are discussed immediately below.

First, the user specifies the Mesh Dimensions by entering the following values:

Number of Zones—The number of zones is equal to the maximum number of control surfaces at a given axial location (i.e., if problem calls for 4 canards, 3 dorsal fins, and 5 tails fins then the user must enter '5' as the number of zones).

No Control Surfaces—This box is selected only when the object has no control surfaces.

Number of Radial Cells—The number of cells located radially between the body surface and the outer boundary of the computational domain.

Default Number of Circumferential Cells/Zone—Changing this parameter will change the number of circumferential cells/zone for all zones.

Number of Cells/Zone—The number of cells/zone refers to the circumferential direction (i.e., between zone edges) and does riot have to be the same for all zones. Change an individual zone by clicking on the desired zone and entering a new value.

Then, the user specifies the Mesh Clustering by entering the following values:

Radial Clustering—Specify the grid clustering between the body surface and the outer boundary. A value of 1.0 provides equal spacing and a value of 0.0 provides maximum clustering at the surface. It should be noted that two sets of radial clustering are required. These correspond to the radial clustering at the initial and final (nose and tail) axial stations. This provides the ability to have more radial clustering at the nose than at the tail of the missile, or vice-versa. The radial clustering parameter is interpolated linearly between the two values as the user progresses axially down the missile. It should also be noted that clicking the 'Boundary Layer Thickness' button provides an estimate of the boundary thickness (laminar and turbulent) at a given axial station. The values are calculated using flat plate boundary layer assumptions and can be used to estimate the amount of radial clustering required for a viscous grid. This calculation requires a unit Reynolds number and an axial location. Initial spacing for the viscous grid is typically taken as 1/30th of the estimated boundary layer thickness.

Circumferential Clustering—Specify the clustering at the zone edges. A value of 1.0 provides equal spacing and a value of 0.0 provides maximum clustering at the zone edges (i.e., circumferentially between control surfaces).

It should be mentioned at this point that the flowfield solver typically does not require mesh clustering because there is no boundary layer to resolve. However, in certain cases, mesh clustering (radial and circumferential) advantageously can be used to more accurately capture specific flowfield features, e.g., vortices, shocks, etc. However, it should also be noted that mesh clustering is required for the Navier-Stokes grid in order to resolve the boundary layer.

Next, the user specifies the Outer Boundary by entering the following values:

Distance to Outer Boundary—If the outer boundary of the computational domain is not tracking a shock (i.e., Free-Stream starting condition) then the radial distance from the body surface to the outer boundary is specified in terms of body radii (typically 10–20 body radii for an inviscid solution).

Growth of Outer Boundary—In certain cases it is desirable for the radial distance between the body surface and the outer boundary to increase as the user marches axially down the missile. This parameter specifies the angle (in degrees) which the outer boundary grows relative to the body surface. It should be noted that the above parameters are used during the Navier-Stokes grid generation. They are also used during the Euler solution when the outer boundary does not track the conical/bow shock. The type of outer boundary applied by the flowfield solver is specified in routine 300, which is discussed in greater detail below.

Finally, the user specifies Copy Parameters by selecting the 'Copy Parameters' button. This permits the Zeus$^{++}$ code to copy the grid parameters from the alternate grid (i.e., from the Navier-Stokes grid if the user is working on the Euler grid setup, or vice-versa).

During subroutine 220 of FIG. 1, the user then defines the missile geometry. The first step in setting up the geometry is to define all of the sections that comprise the missile surface, not control surfaces. This is performed using the missile selection box illustrated in FIG. 4. First, the user selects the desired type of nose; the user then clicks on 'Add New Section' to add the nose section to the missile. It will be appreciated that the user will be prompted for the geometric parameters used to generate the desired type of nose section.

After the nose section has been specified, the above-described process is repeated for any remaining sections, i.e., afterbody, boat-tail, etc. It should be noted that the sections defining the missile geometry must be entered in the order in which they occur on the missile.

Figure 4:
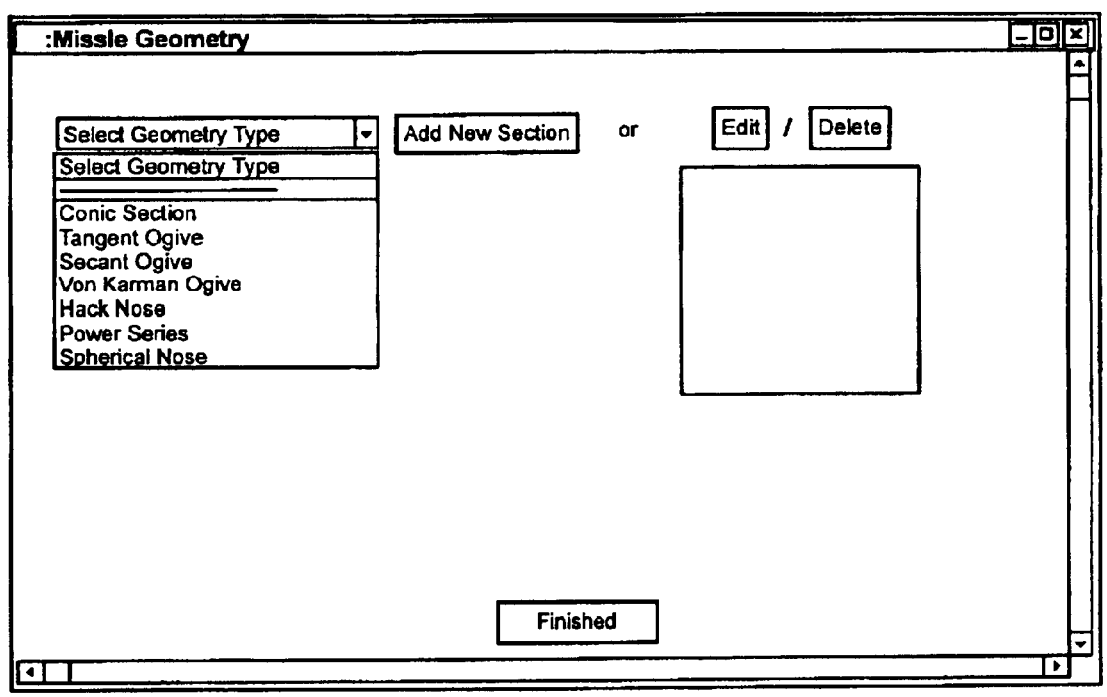
FIG. 4 is a screen capture of a Missile Geometry panel generated by the Zeus$^{++}$ code tool.

It should be noted from FIG. 4 that there are a variety of possible missile sections. A sample sketch, a description of the required parameters, and the generating equations are shown below in FIGS. 5a–5g, and 6, for the nosecone and body cross section sections, respectively. It should be noted that in all of the geometric formulas discussed below, 'z' is the axial distance with respect to the start of the section being defined.

Figure 5A:
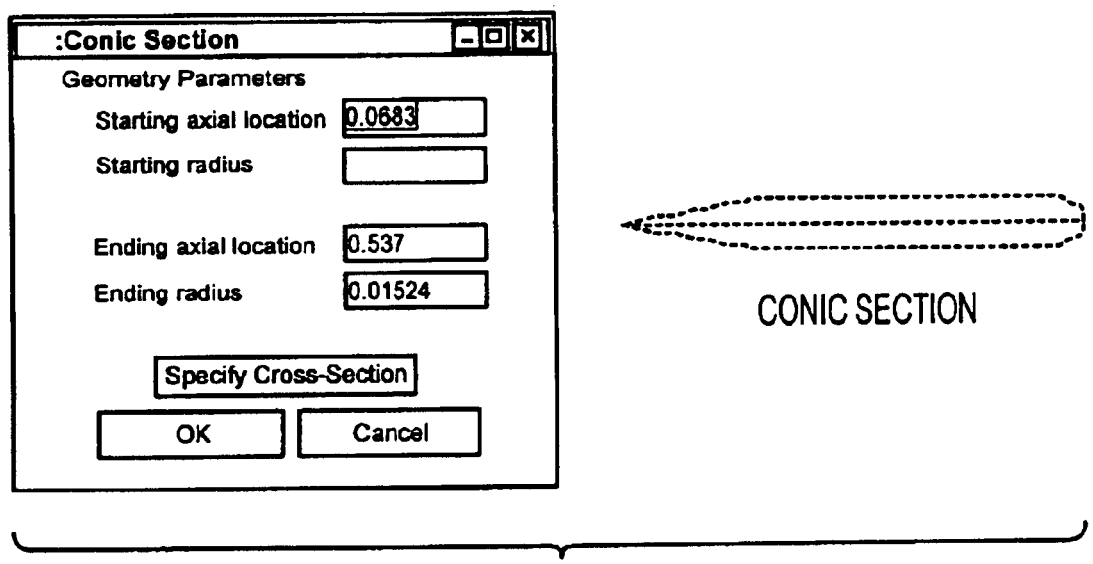

FIG. 5a illustrates the dialog box, and the corresponding shape, which the user defines a conic section of, for example, a missile. It will be appreciated that a variety of geometries can be described using the conic input section. These include those shown in the sketch above, namely, a nose cone, a cylindrical section, and a boat-tail flare. The parameters required to generate a conic section are shown in FIG. 5a.

FIG. 5b illustrates the dialog box for entry of parameters required to generate a tangent ogive section, a sample sketch of a tangent ogive, and the equation set employed in generating the tangent ogive section. It will be noted from the sketch that the missile section is tangent to the horizontal at the aft axial station, hence the name tangent ogive. The geometry is generated using the formula illustrated in FIG. 5b, along with the user specified parameters R and L, where R is the base radius and L is the length of the section. It should be mentioned that all of these equation sets are discussed in the document by Hymer, T. C.; Moore, F. G.; and Downs, C., entitled *User's Guide for an Interactive Personal Computer Interface for the Aeroprediction Code*, NSWC-DD TR 94-107, June 1994, which document is incorporated herein by reference for all purposes.

Figure 5C:
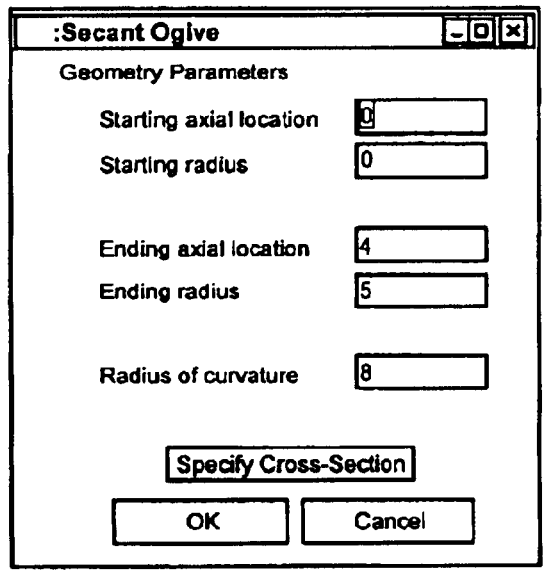

Still referring overall to subroutine 220 of FIG. 1, FIG. 5c illustrates the dialog box for entry of parameters required to generate a secant ogive, a sample sketch of the secant ogive, and the equation set employed in generating the secant ogive section. The geometry is generated using the formula discussed in the Hymer et al. document mentioned above along with the user specified parameters L, R, and r, where L is the length of the section, R is the base radius, and r is the radius of curvature.

Figure 5D:
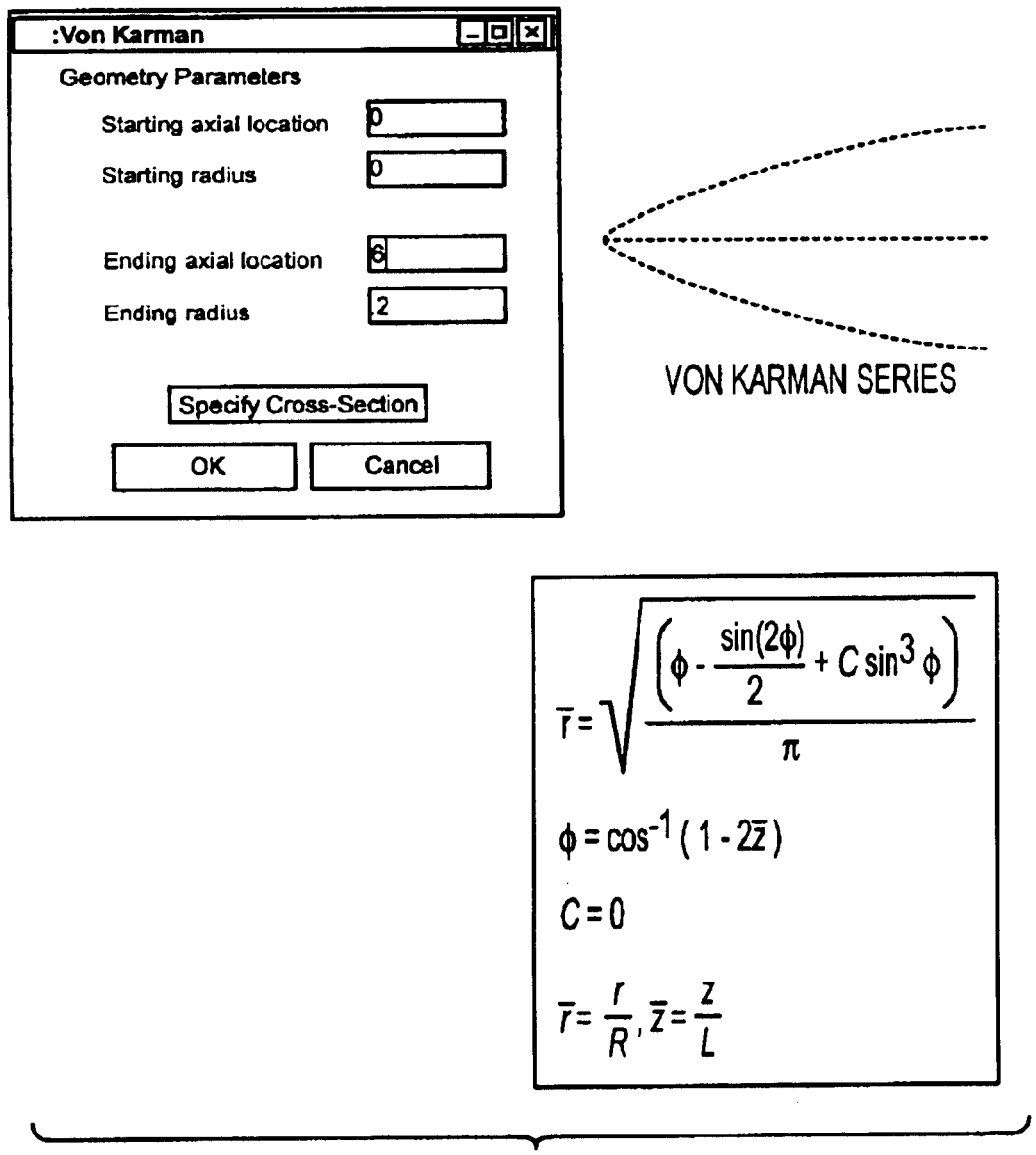

FIG. 5d illustrates the dialog box for entry of parameters required to generate a Von Karman ogive, a sample sketch of the Von Karman ogive, and the equation set employed in generating the Von Karman ogive section. The geometry is generated using the formula discussed in the Hymer et al. document mentioned above along with the user specified parameters R and L, where R is the base radius and L is the length of the section.

Moreover, FIG. 5e illustrates the dialog box for entry of parameters required to generate a Haack series nose section, a sample sketch of a Haack series section, and the equation set used in generating the Haack series section. It will be appreciated that this section advantageously can be generated using the formula discussed in the Hymer et al. document mentioned above along with the user specified parameters R and L, where R is the base radius and L is the length of the section.

Furthermore, FIG. 5f illustrates the dialog box for entry of parameters required to generate a Power series section, a sample sketch of the Power series section, and the equation set used in generating the Power series section. Advantageously, this geometry is generated using the formula discussed in the Hymer et al. document mentioned above along with the user-specified parameters R, L, and n, where R is the base radius, L is the length of the section, and n is the power series exponent.

Figure 5G:
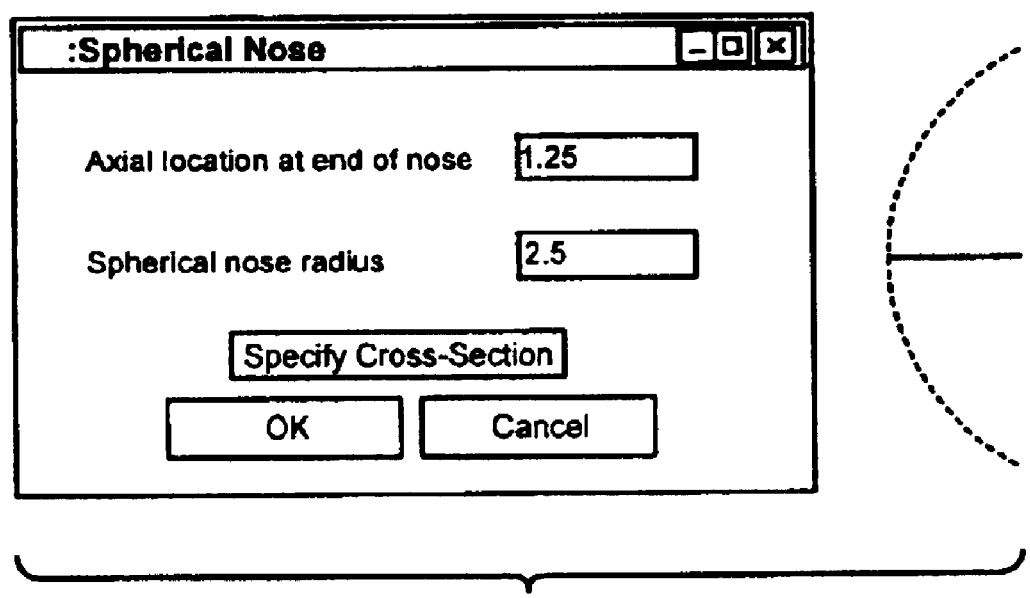

Finally, FIG. 5g illustrates the dialog box for entry of parameters required to generate a spherical nose section, and a sample sketch of the spherical section. It should be mentioned that for the spherical nose section there will be a small region where the flow is subsonic. Because the Euler solver employs a marching procedure, the Zeus code cannot be applied in this subsonic region. Therefore, the blunt body solver must be applied over the entire subsonic region. The outflow plane from the blunt body solver can then be taken as the inflow plane for the Euler solver. The input parameters for the blunt body solver are specified below with respect to subroutine 320.

Figure 6:
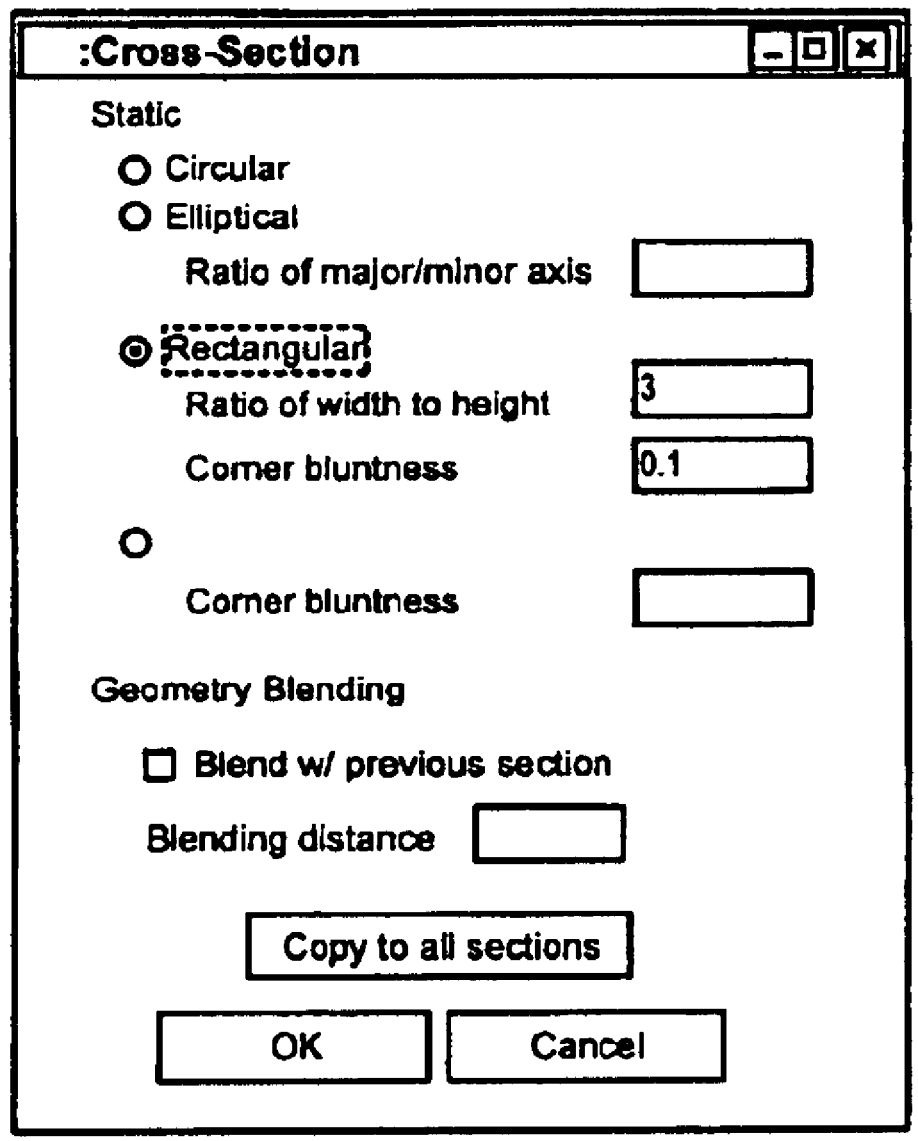
FIG. 6 is a screen capture of the data entry panel for defining the cross section of each of the geometric representations of FIGS. 5a–5g.

It should be noted that for each of the missile body sections discussed with respect to FIGS. 5a–5g, the cross sectional geometry must be specified. FIG. 6 illustrates the dialog box for entry of the parameters describing the cross-sectional geometry. It should also be noted that if a cross section is not specified, the Zeus++ code tool assumes and employs a circular cross section. The parameters which advantageously can be set using the box of FIG. 6 include:

Cross-Section—Select the desired cross-sectional geometry.

Corner Bluntness—Specify a value between zero (no blunting) and 0.999 (completely blunted corners) for the Rectangular cross-sectional geometry.

Blending—It is often desirable to have varying cross-sectional geometries for different sections of the missile (i.e., circular nose cone and elliptical afterbody). For these cases, the cross-sectional geometry cannot be abruptly changed, but rather, must be blended axially between the two sections. If blending is desired, then select the 'Blend w/ previous section' box and specify a blending distance in ft/m.

Figure 7:
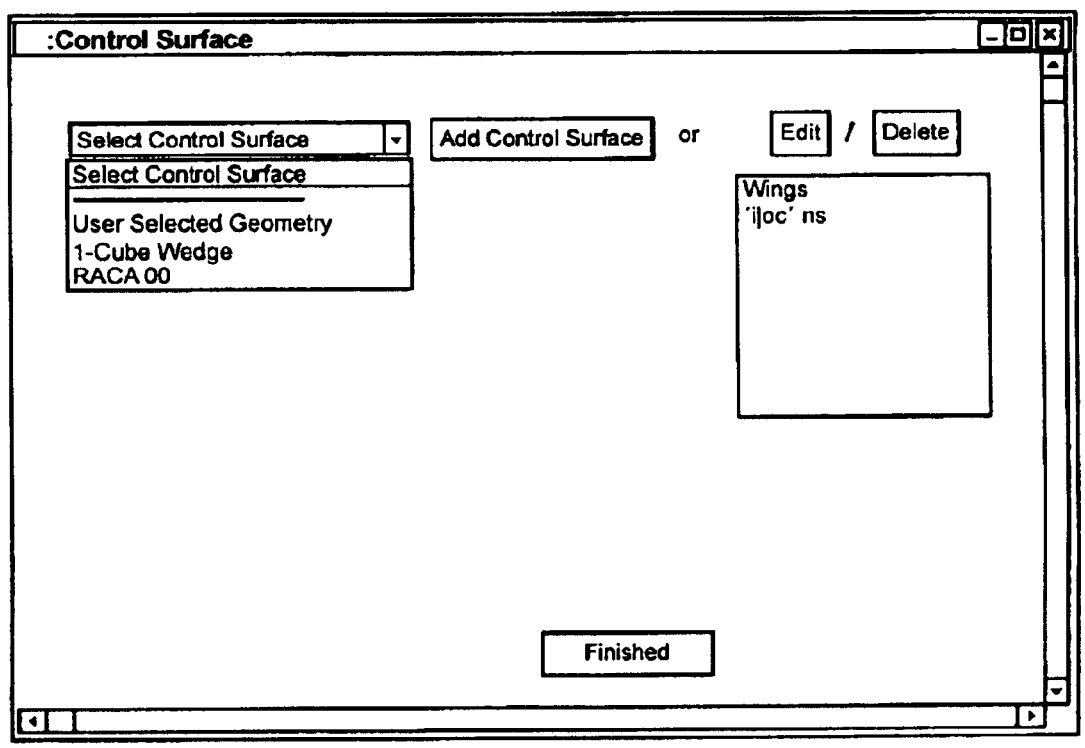
FIG. 7 is a screen capture of a Control Surfaces panel generated by the Zeus$^{++}$ code tool.

When the complete missile body geometry has been specified, subroutine 220 ends and the subroutine 200 jumps to subroutine 230, where the control surfaces are specified. In will be appreciated that the control surfaces must be entered in the order in which they appear on the missile, just as was the case for the missile body geometry. If no control surfaces will be examined, then the 'No Control Surfaces' parameter must be selected in during subroutine 210. During subroutine 230, the user selects the desired type of control surface from the drop down menu and clicks on 'Add Control Surface'. It should be noted from FIG. 7 that there are a variety of possible control surfaces. A detailed discussion of these control surface variations is presented below.

Before specifying the geometry of the control surfaces, a number of parameters, which are discussed immediately below and which describe the location/orientation of the surfaces on the missile, must be specified. These parameters are entered via the dialog box illustrated in FIG. 8. Preferably, these parameters are as follows:

Label Section—Enter a text label that describes the control surface.

Hinge Line—Enter the axial distance to the control surface hinge line measured from the missile nose. The hinge line is the point on the control surface about which deflections are made.

Overlap Previous Control Surface—Select this option when two different types of control surfaces are desired at a given axial location, i.e., different size vertical and horizontal stabilizers. A detailed description of this feature is discussed in detail below.

Offset Angles—The offset angles describe the orientation of the fins. For the '+' configuration the corresponding angles are 90°, 180°, 270°, and 360°. Similarly, for the 'x' configuration the angles are 45°, 135°, 225°, and 315°. It should be noted that the Zeus++ code does not require any form of symmetry, and therefore, any desired combination of offset and/or deflection angles may be specified. It should also be noted that the control surfaces must lie on a zonal boundary. Therefore, the zone orientations are equivalent to the offset angles. In other words, the zone edges will occur at the above-specified offset angles.

Deflection Angles—The deflection angles are specified in a clockwise manner. In other words, specifying +10 for both the 90° and 270 fins would pitch the former up and the latter down 10°. If a symmetric deflection is desired, the required inputs are +10 for the 90° and –10 for the 270° fin. It should be noted that the Zeus++ code does not require any form of symmetry, and therefore, any desired combination of offset and/or deflection angles may be specified.

Aileron/Slat Angles—In addition to deflecting the entire surface about the hinge line (see above), it is also possible to deflect a portion of a control surface. This feature allows for the modeling of either Aileron or Slat type controls. To model either a slat or an aileron, first select on the 'Model Slats/Ailerons' and then enter the appropriate deflections in the 'Ailerons/Slats Angles' dialog box. Finally, enter the 'ilocation' of either the slat termination point or the aileron initiation point. The 'iloc' parameter corresponds to the index of the termination/initiation point along each plane defining the control surface and is explained in detail below with respect to User Defined Geometry. It should be mentioned that when modeling either flaps or slats, it is not possible to deflect a portion of the trailing/leading edges. The entire edge is deflected about the 'iloc' point by the amount specified in the Aileron/Slat Angles dialog box.

Delete a Fin—The number of fins is equal to the maximum number of zones specified in the grid parameter section. However, it is possible to delete a fin by right-mouse clicking on the desired fin. Deletion causes the offset, deflection, and the Aileron/Slat angles to be replaced with '—' to indicate that they have been eliminated. To add the fin back into the calculation, simply right click on it a second time. This feature is useful if a variable number of fins are desired for the different sets of control surfaces, i.e., 2 canards and 4 tail fins. Still referring to subroutine 230 of FIG. 1, it will be appreciated that the shape of the control surfaces have yet to be defined. The most general method of specifying the control surface geometry is the 'User Defined Geometry' option shown in FIG. 7. For this method, the actual geometry points (x, y, z) are prescribed by the user. The generality of this method allows nearly any form of symmetric control surface to be examined. Two exemplary cases will be discussed immediately below, the first of which is a simple modified wedge control surface illustrated in FIG. 9a, the second being a more complex control surface where three planes must be considered to properly define the geometry, as illustrated in FIG. 9b.

Figure 9A:
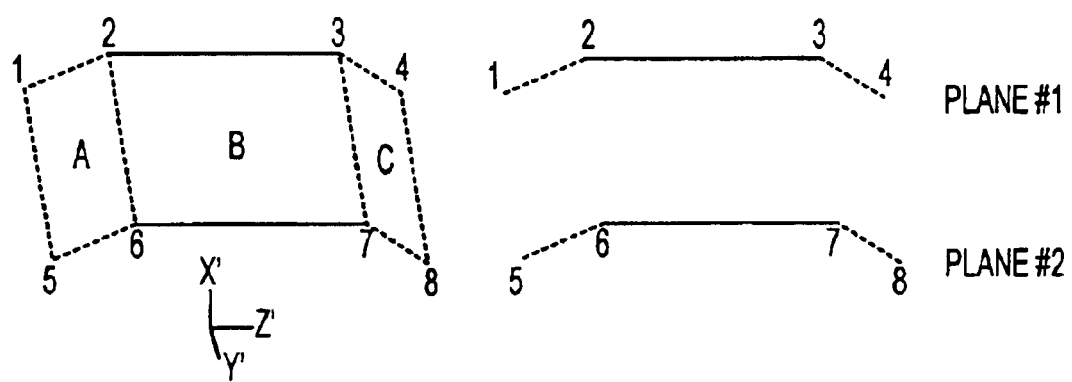
FIGS. 9a and 9b illustrate first and second exemplary user defined control surfaces which can be defined for the Zeus$^{++}$ code tool.
Figure 9B:
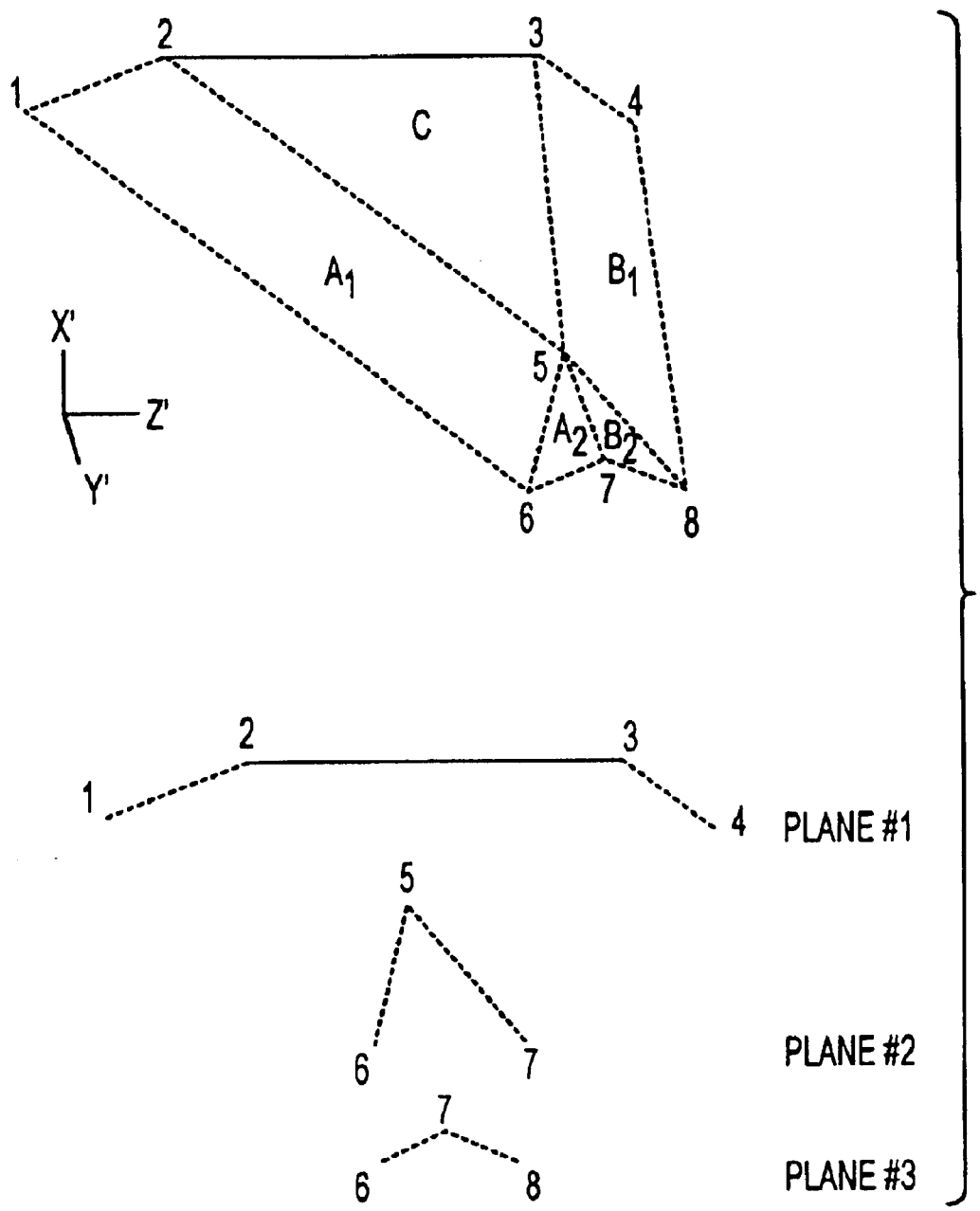

FIG. 9a illustrates the upper half of the symmetric control surface and would mate to the missile body along edge '1-2-3-4'. It will be appreciated that the Zeus++ code tool requires that the control surfaces be described by a series of planar surfaces (see 'A', 'B', and 'C' in FIG. 9a). In other words, planes 'A', 'B', and 'C' each have a single unit outer normal. This allows the Zeus$^{++}$ code tool to calculate unit normals to each section and, hence, to generate a computational domain around the control surface. The control surface geometry is specified by decomposition into a series of planes, all of which must have the same number of node points. For FIG. 9a, the surfaces 'A', 'B', and 'C' are described by specifying two planes with four points on each plane, i.e., Points '1', '2', '3', and '4' define Plane #1 while Points '5', '6', '7', and '8' define Plane #2. The first plane, i.e., Plane #1, corresponds to the root chord, i.e., lies along the missile surface. Successive planes march outwards until the final plane, i.e., Plane #2, is reached at the tip chord.

It should be noted that the coordinate system for entering the control surface points is based on a fin local system, where:

'x' is the thickness of the control surface.

'y' is the radial distance measured relative to the missile surface. (y=0 corresponds to the surface of the missile).

'z' is the axial distance measured relative to the hinge line.

It should also be noted that the control surfaces must be symmetric and, therefore, only the upper half of the control surface is specified when 'User Defined Geometry' is specified. Because of this symmetry requirement, the leading and trailing edges of the fin must have zero thickness, i.e., x=0. This requires that x be zero for the first and last points on each plane describing the control surface. Furthermore, it should be noted that each plane must contain the same number of node points, i.e., four for the above example.

The exemplary case illustrated in FIG. 9a advantageously can be used to model either slats or flaps. It will be appreciated that four points are used to define each of the planes, i.e., Plane #1 and Plane #2. To model slats, the user simply sets the 'iloc' parameter to '2', selects the 'Fore of iloc (Slats)' dialog, and specifies the slat deflection angle in the Control Surface Parameters screen illustrated in FIG. 8. This causes all points ahead of 'iloc' (surface 'A') to be deflected by the specified slat angle. Similarly, to model flaps, set 'iloc' equal to 3 and select the 'Aft of iloc (Flaps)' dialog to deflect all points aft of the third planar point (i.e., deflect surface 'C').

The second exemplary case, which is illustrated in FIG. 9b, represents a more complex control surface where three planes must be considered to properly define the control surface geometry. From FIG. 9b, it will be appreciated that the surfaces '$A_1$' and '$A_2$' are not equivalent planar surfaces, i.e., these surfaces do not have the same unit outer normal. A similar observation can be made with respect to the trailing edge of the fin, i.e., surfaces '$B_1$' and '$B_2$'. Therefore, the control surface illustrated in FIG. 9b cannot be described using only Plane #1 and Plane #3 shown above. Plane #2 must be included to properly describe the control surface. It should be noted that each plane must contain the same number of nodal points. Plane #1 contains four nodal points; therefore, Planes #2 and #3 must also contain four points. To meet this constraint, the user simply enters the center point for planes '2' and '3' twice, i.e., duplicate points '5' and '7'.

Entry of the 'User Defined Geometry' definitions is performed in the dialog box illustrated in FIG. 10. First, the user enters all of the 'x' points for a given plane, then all of the 'y' points, and finally, all of the 'z' points. The user then clicks the 'Next Plane' button to continue the process until all planes have been entered, at which point the user clicks on 'Finished' button in the dialog box. In the dialog box of FIG. 10, the following definitions apply:

'x', 'y', 'z' points—Local fin coordinates used for specifying the control surface geometry. 'x' is the fin thickness, 'y' is the radial distance measured from the missile surface, and 'z' is the axial distance measured relative to the hinge line.

Planes—Displays the current plane as well as the maximum plane number.

Figure 11:
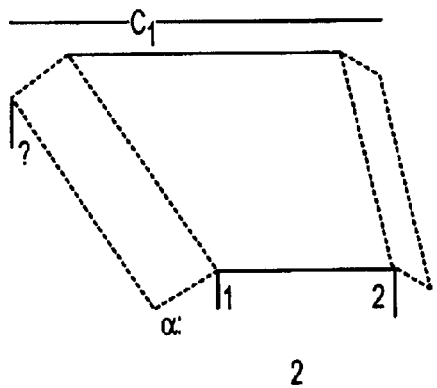
FIG. 11 is a screen capture of a Modified Wedge Control Surface data entry panel generated by the Zeus$^{++}$ code tool.

A first alternative control surface geometry, i.e., the modified wedge, is illustrated in FIG. 11, which depicts both a screen capture of the respective data entry panel and an illustration of the control surface itself. This panel advantageously can be used in place of the 'User Defined Geometry' panel to simplify the geometric inputs required by the user. From FIG. 11, it will be appreciated that these parameters are:

Half Angles—Enter both the leading and trailing edge half angles ($a_1$ and $a_2$, respectively).

Sweep Angle—Enter the leading edge sweep angle (b).

Span—Enter the control surface span (b).

Distance to Hinge Line—Enter the distance (on the root chord) from the leading edge to the hinge line.

Wedge Thickness—Enter the leading/trailing edge wedge thickness at both the root and the tip of the control surface (t, and $t_2$, respectively).

Chord—Enter the root and tip chords (c, and $c_2$, respectively)

Convert—When entering a control surface, it is often desirable to make modifications to the types of control surfaces allowed in Zeus$^{++}$ code. If the control surface under consideration is similar to a modified wedge then start by entering all of the aforementioned parameters, then press the 'Convert to User Specified Geometry' button to convert the wedge parameters to 'x', 'y', 'z' coordinates. It is then possible to modify the individual points to obtain the exact control surface desired.

A second alternative control surface geometry, i.e., the symmetric NACA00xx airfoil, is illustrated in FIG. 12, which depicts a screen capture of the respective data entry panel, an illustration of the control surface itself, and the equation block. This panel can also be used in place of the 'User Defined Geometry' panel to simplify the geometric inputs required by the user. From FIG. 12, it will be appreciated that these parameters are:

Number of Points—Enter the number of points used to describe the airfoil geometry. Note that increasing this number will not significantly increase the computational time. It is simply the number of points used to draw the two-dimensional airfoil curve.

Thickness Ratio—Enter the thickness ratio as a percentage of the chord (i.e., 12% refers to a thickness of 0.12*chord)

Sweep Angle—Enter the leading edge sweep angle in degrees.

Span—Enter the span (i.e., distance from root to tip).

Root/Tip Chord—Enter both the root and tip chords.

Distance to Hinge Line—Enter the normalized distance (h/c) from the leading edge to the hinge line (0–1) along the root chord.

Convert—When entering a control surface, it is often desirable to make modifications to the types of control surfaces allowed in Zeus$^{++}$. If the control surface under consideration is similar to a NACA 4-digit airfoil then start by entering all of the aforementioned parameters, then press the 'Convert to User Specified Geometry' button to convert the fin parameters to a set of 'x', 'y', 'z' coordinates. It is then possible to modify the node points to obtain the exact control surface desired.

It should be mentioned that in the equation block used to calculate the symmetric NACA00xx airfoils depicted in FIG. 12, xx refers to the maximum thickness ratio, 'r' is the local radius, 'z' is the axial distance, 'c' is the chord, and 't' is the airfoil thickness ratio (thickness/chord). It will be noted that, due to the bluntness of the leading edge, difficulty will most likely be encountered if this fin is evaluated in the Euler solver. It can, however, be used to generate a Navier-Stokes grid.

It is often desirable to consider different types of control surfaces at a given axial location, i.e., different size vertical and horizontal stabilizers. The Zeus++ code tool implements this feature by linking two sets of control surfaces together, as described by the following example.

(1) The user defines the first control surface. In an exemplary case, the user creates a 4 finned configuration oriented in the '+'configuration, i.e., fins at 90°, 180°, 270°, and 360°.

(2) The user deletes the 90° and 270° fins on the first control surface.

(3) The user then defines a second control surface.

(4) The user deletes the opposing fins on the second control surface, i.e., the 180° and 360° control surfaces.

Figure 8:
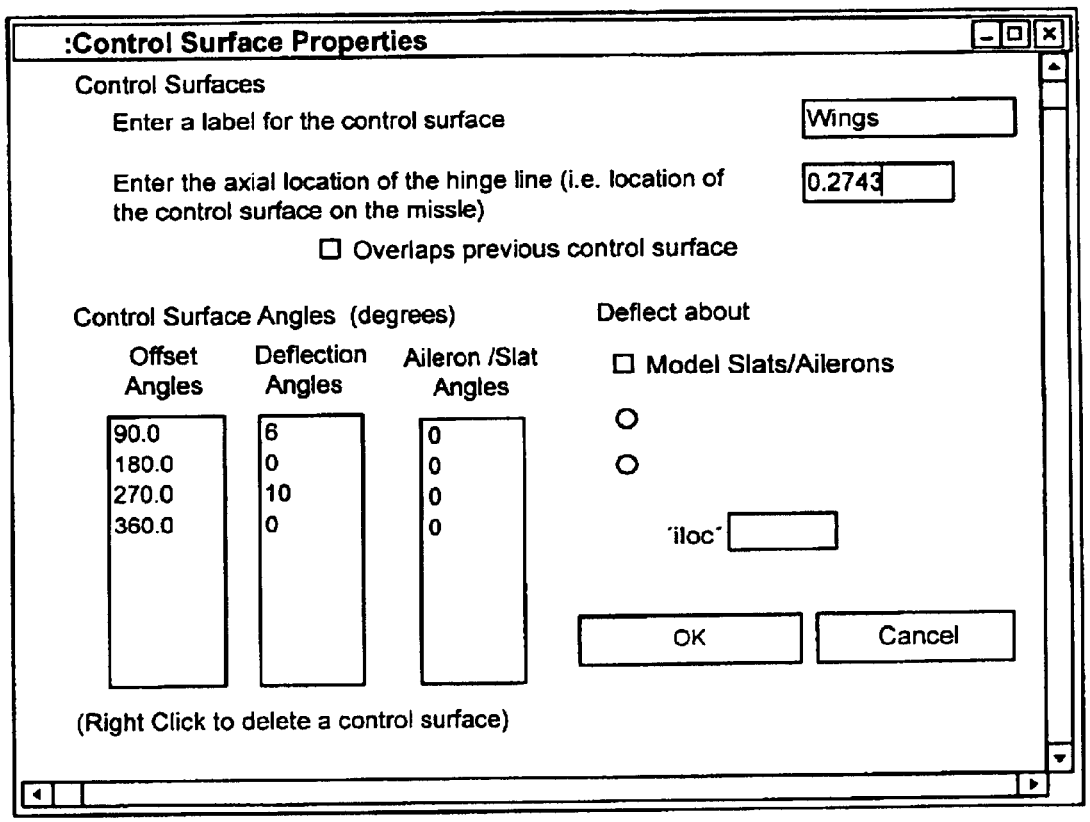
FIG. 8 is a screen capture of a Control Surface Properties panel generated by the Zeus$^{++}$ code tool permitting specification of the location and orientation of these surfaces.

(5) Finally, the user selects the "Overlap Previous Control Surface" dialog button in the data entry panel illustrated in FIG. 8 for the second set of control surfaces.

Still referring to FIG. 1, when subroutine 230 has been completed, i.e., when the control surfaces have been completely defined, subroutine 240 is initiated to generate the computational domain, as discussed in greater detail below. However, it should be noted that subroutine 240 is optional; the user may elect to proceed directly to subroutine 310 of routine 300.

It will be appreciated from the discussion thus far that the Zeus++ code tool according to the present invention is capable of operating with respect to two separate computational domains: the Euler grid; and the Navier-Stokes grid. The Euler grid is the one used by the Zeus++ tool, as discussed in detail below, for the inviscid and boundary layer solvers. The Navier-Stokes grid is generated, along with the appropriate boundary condition files; however, this grid is not used by the Zeus++ tool in the flowfield analysis. Rather, this grid (and its corresponding file) is created for use in a full Navier-Stokes solver.

With respect to subroutine 240, it will also be appreciated that a number of menu options are available to the user; the first dealing with the inviscid Euler grid and the remaining three pertaining to the Navier-Stokes grid, as outlined in Table II.

TABLE II

| | |
|---|---|
| Euler Grid | Generate and view the Euler grid |
| Generate N-S Grid | Generate the Navier-Stokes grid and boundary condition data files 'filename\RunGrind\GASPGrid.p3da' & 'GASPBC.inp' |
| Normal Spacing | View the radial spacing (at the first point off the wall) along the missile |
| View N-S Grid | Plot the Navier-Stokes grid. |

With respect to the Euler grid option of subroutine 240, it will be appreciated that before running the inviscid code, it is often desirable to examine the computational domain to ensure that the relevant geometric features are spatially resolved and to ensure that the control surfaces are input correctly. Two methods of viewing the computational domain are available and are shown in the Grid Inputs dialog box depicted in FIG. 13. In the first, the grid is viewed as a series of two-dimensional planes, as depicted in FIG. 13. The second method displays the Euler grid in three-dimensional block format.

It should be mentioned that when using the '2d planes' option, it is possible to generate a movie of the grid that steps axially along the missile. To generate the movie file from the two-dimensional grid, the user runs the Tecplot macro 'Playback\2dGrid_Movie.mcr'. The movie file is written to the file 'Playback\Zeus_Grid2d.rm' and advantageously can be replayed using the Tecplot Framer program, which is included in the Tecplot product.

It will be noted that the axial stepsize taken during the inviscid computation is controlled by the Courant-Friederichs-Lewy (CFL) stability condition specified in routine 300, which is discussed in greater detail below. Moreover, this is calculated at run-time and, therefore, the axial steps taken during the grid generation are not equivalent to those taken during the actual solution. For the purpose of evaluating the computational domain, equal axial spacing is taken along the missile. It will also be noted that there are two possible methods for generating the outer boundary of the computational domain. In the first method, it is specified in terms of body radii during performance of subroutine 210, which was previously discussed. In the second method, the outer boundary tracks the conical shock as the solution proceeds downstream. For this latter method, the conical shock location, and thus the outer boundary, is not known until runtime and, therefore, for the purposes of grid generation, the first method of calculating the outer boundary will be employed. Finally, it will be noted that the viewing of the Euler grid is not a condition precedent for executing the inviscid solution. The actual grid used during the inviscid computation is calculated at runtime and can be viewed during the routine 500 post-processing features of the Zeus++ code tool.

In any event, the necessary parameters for establishing the Euler grid as entered using the dialog box depicted in FIG. 13. These parameters include:

Plot Type—Generate the grid as either a series of two-dimensional planes (i.e., each plane is written as a separate Tecplot zone), or a one three-dimensional grid (i.e., block format).

Starting/Final Zeta—Enter the starting and final axial locations for the grid generation. Any subsection can be viewed using the grid generator, and therefore, the zeta values do not have to correspond to the starting/final axial locations of the missile.

Number of Steps—Enter the number of axial steps to be taken. The axial stepsize is assumed constant for the purposes of grid generation and is calculated linearly using the starting and final zeta values specified above.

Figure 14:
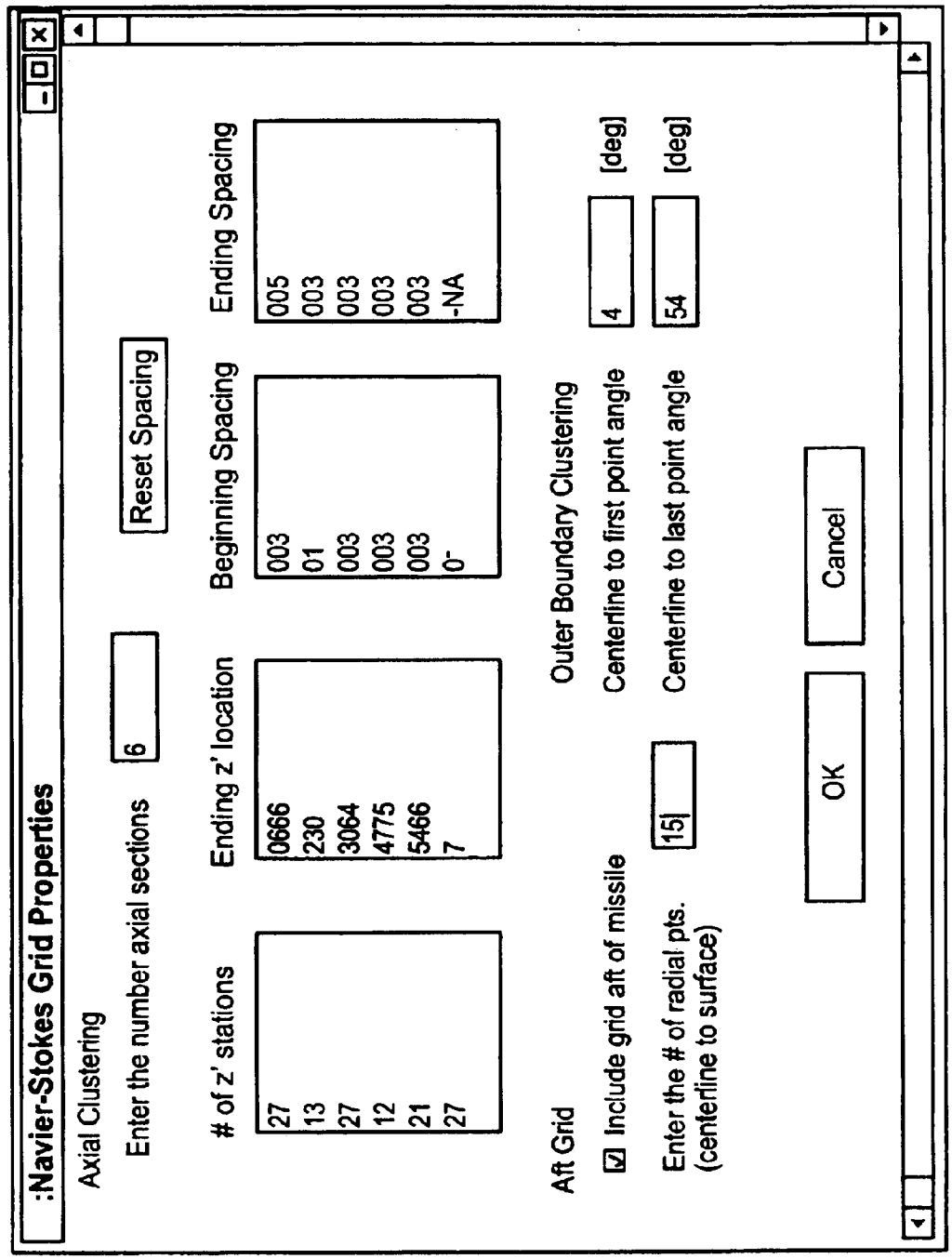
FIG. 14 is a screen capture of a Navier-Stokes Grid Properties dialog box presented by the Zeus++ code tool according to the present invention.

As previously mentioned, the Zeus++ code tool advantageously can be used to generate solutions for missile type geometries using both an Euler and a boundary layer solver. However, it is often desirable to perform a more in-depth analysis using a full Navier-Stokes solver. For these cases, the Zeus++ tool serves as a grid generator, allowing the user to create complex three-dimensional grids in a matter of minutes. Preferably, the Zeus++ code tool is setup to generate CFD grids in Plot3d format ('filename\RunGrid\GASPGrid.p3da') along with the appropriate zonal boundary conditions ('filename\RunGrid\GASPBC.inp') for the GASP flow solver, i.e., the GASP v3 Computational Fluid Dynamics Solver product produced by Aerosoft, Inc. The boundary condition file generated using the Navier-Stokes Grid Properties dialog box illustrated in FIG. 14 specifies each point on a zone edge as either a solid surface (a fin) or a zonal boundary, and includes:

Axial Clustering—In this section the axial clustering for the Navier-Stokes grid is specified. The radial and circumferential values are declared during performance of subroutine 210, discussed above. It will be noted that the Zeus$^{++}$ code tool uses a Newton method to calculate the axial clustering parameters (i.e., geometric stretching factors). To prevent a divergent solution, a valid initial spacing must be provided. This is accomplished by first specifying the number of axial sections along the missile. Next, the user enters the number of points and the ending axial location for each section. Finally, the user clicks on the 'Reset Spacing' button to calculate the appropriate parameters for an equally spaced grid. Once a valid grid has been obtained, the beginning/ending spacing can be adjusted incrementally by the user to obtain the desired axial clustering. It will also be noted that the grid and boundary condition output files produced during the grid generation process are often times very large and, therefore, may take a significant amount of time to generate. Also, the process of determining the appropriate axial clustering is an iterative procedure, and is independent of the circumferential layout of the grid. Therefore, to minimize the amount of calculation required per iteration, the user preferably sets the number of circumferential points to unity in the Navier-Stokes grid section. After the desired axial clustering is obtained, the user advantageously can reset the number of circumferential points to any desired value and regenerate the final Navier-Stokes grid.

Number of Axial Stations—Specify the number of axial sections in which clustering is desired. For the sample grid shown below the six sections designated are distinguished by the vertical tic marks. The division shown in the example allows for axial clustering at the beginning/end of the nose section, leading/trailing edges of both sets of fins, as well as clustering at the aft end of the missile.

Number of 'z' Stations—The number of axial points per section.

Ending 'z' Location—Ending axial location for each section [ft/m].

Reset Spacing—Reset the beginning/ending axial spacing in each section to obtain equal spacing in all sections.

Beginning Spacing—Beginning axial spacing (Dz) for each section [ft/m].

Ending Spacing—Ending axial spacing (Dz) for each section [ft/m].

Aft Grid—If a grid aft of the missile is desired (subsonic flow) then this checkbox must be selected.

Number of Radial Points—This refers to the points which lie radially between the missile centerline and the missile surface directly behind the missile (see yellow grid section or area designated by the horizontal tic marks). The radial spacing at the first point is taken to be the same as that on the surface (at the aft end) of the missile. The Zeus$^{++}$ code tool calculates the geometric stretching parameter that places the final radial point along the missile centerline. If the error message 'Unattainable radial clustering' is displayed, try reducing the number of radial points in the aft grid section.

Outer Boundary Clustering—Specify the outer boundary clustering around the nose section of the missile.

Figure 15:
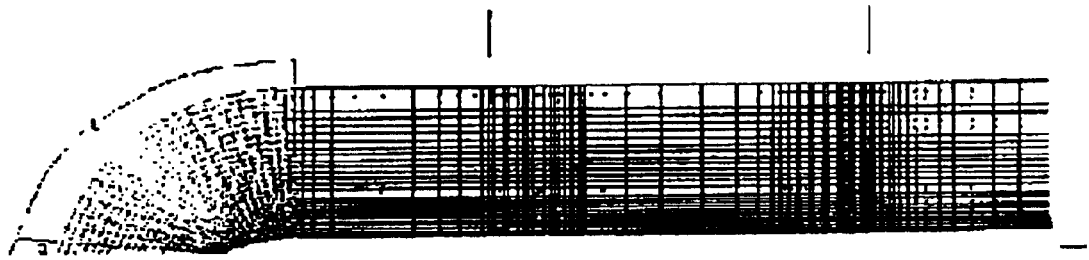
FIG. 15 illustrates an exemplary cross section of the Navier-Stokes grid generated by the Zeus++ code tool.

First Point Angle—The angle between the missile centerline and the first nose point [degrees]. See angle 'a' in FIG. 15. It should be noted here that the angle must be greater than 0 degrees.

Last Point Angle—The angle between the missile centerline and the final nose point [degrees]. See angle 'b' in FIG. 15. It should be noted here that the angle must be less than 90 degrees.

Figure 16:
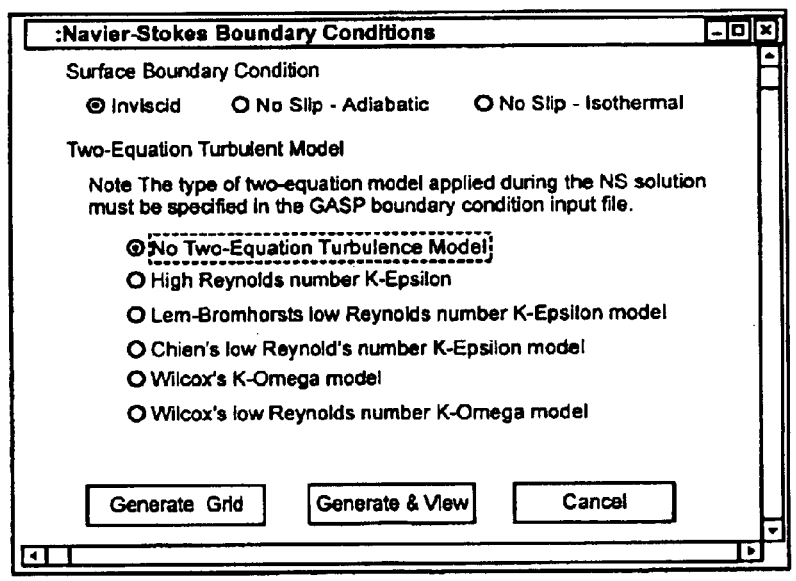
FIG. 16 is a screen capture of a Navier-Stokes Boundary Conditions dialog box produced by the Zeus++ code tool.

The final step in generating a Navier-Stokes grid is to specify the surface boundary conditions, which, as indicated in FIG. 16, include:

Surface Boundary Condition—Specify the type of boundary condition to be employed when a solid surface is encountered. Preferably, the Zeus$^{++}$ code tool generates a boundary condition file for the GASP flow solver, which specifies the boundary condition along the zone edges (i.e., solid surface or zonal boundary).

Two-Equation Model—The type of two-equation turbulence model applied during the Navier-Stokes solution must be specified in the GASP boundary condition input file.

Still referring to subroutine 240 in FIG. 1, it should be mentioned that one prerequisite for accurately computing a Navier-Stokes solution is the spatial resolution of the boundary layer. Therefore, the computational grid must be appropriately refined near the surface. The boundary layer thickness cannot be determined a priori, however. Thus, an approximate value advantageously can be obtained using flat plate assumptions. Using this estimate for the boundary layer thickness, the radial clustering parameter can be increased/decreased until an appropriate value for the normal spacing to the first point off the surface is obtained. A typical value for the required normal spacing is 1/20th to 1/30th of the approximate boundary layer thickness (i.e., approximately 20–30 points in the boundary layer).

Subroutine 240 also proves a view grid option, which advantageously plots the Navier-Stokes grid in three-dimensional block format using the Tecplot plotting package mentioned above. Beneficially, a two-dimensional slice of the three-dimensional grid can be obtained by executing the Tecplot macro 'Playback\GaspGrid.mcr'. This is the view displayed in the Generate Gasp Grid parameters discussed with respect to FIG. 14. It will be appreciated that this view is useful for evaluating the axial clustering parameters as well as the spatial resolution of the control surfaces. It will be noted that the control surfaces are represented by the contour plot variable 'onfin'; Unity and zero represent a solid surface and a zonal boundary, respectively. To evaluate the spatial resolution of the control surfaces, the user advantageously could examine a contour plot of the 'onfin' parameter.

After the computational domain, missile, and control surface geometries have been specified during routine 200, routine 300 is performed to input the following parameters:

(1) Aerodynamic Data;

(2) Integration Controls;

(3) Separation Modeling Parameters;

(4) Boundary Layer Controls; and (5) Output Controls.

It will be appreciated that a variety of parameters are required before execution of the Euler or boundary layer solvers. These runtime parameters are specified in the 'Inputs' routine, i.e., routine 300.

Figure 17A:
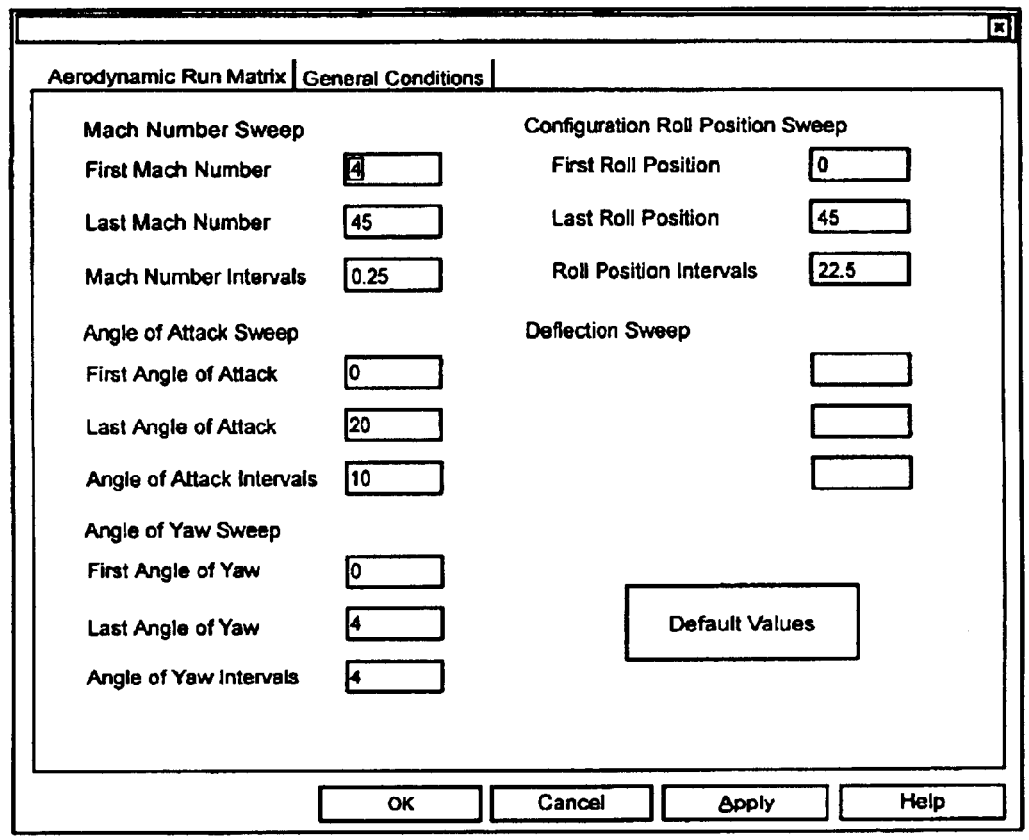
FIGS. 17a and 17b are screen captures of dialog boxes permitting selection of aerodynamic sweep parameters and general aerodynamic input parameters, respectively, produced by the Zeus++ code tool according to the present invention.

During subroutine 310, the user specifies the Mach numbers and missile orientations, e.g., angle of attack, yaw, and roll, which advantageously are employed during execution of the flow solver routine 400, in the dialog box depicted in FIG. 17*a*. Rather than specifying singular values, sweeps are defined for each of the above mentioned parameters. The Aerodynamic Run Matrix of FIG. 17*a* advantageously can be used to input the Mach numbers and missile orientations. More specifically, this is accomplished by entering initial, final, and incremental values for Mach number, angle of attack, angle of yaw, and roll angle. The Zeus$^{++}$ code tool then calculates an Aerodynamic Run Matrix consisting of all possible cases. The parameters input via the dialog box depicted in FIG. 17*a* include:

Mach Number Sweep—Enter the starting, final, and incremental Mach number. For the sample shown above, a Mach number of 4.0, 4.25, and 4.50 will be considered.

Angle of Attack Sweep—Enter the starting, final, and incremental angle of attack.

Angle of Yaw Sweep—Enter the starting, final, and incremental yaw angle.

Roll Angle Sweep—Enter the starting, final, and incremental roll angle.

Deflection Sweep—Enter the first tail defection, the last tail deflection and the deflection interval.

It should be noted that for each case (i.e., every Mach number, angle of attack, angle of yaw, and roll angle combination), the Zeus$^{++}$ code tool generates a subdirectory under the main directory, with each subdirectory being labeled Run0001–Runxxxx. In addition, the Zeus$^{++}$ code tool advantageously generates a file called RunMatrix.txt, which file maps the case number to the aerodynamic parameters entered above.

Figure 17B:
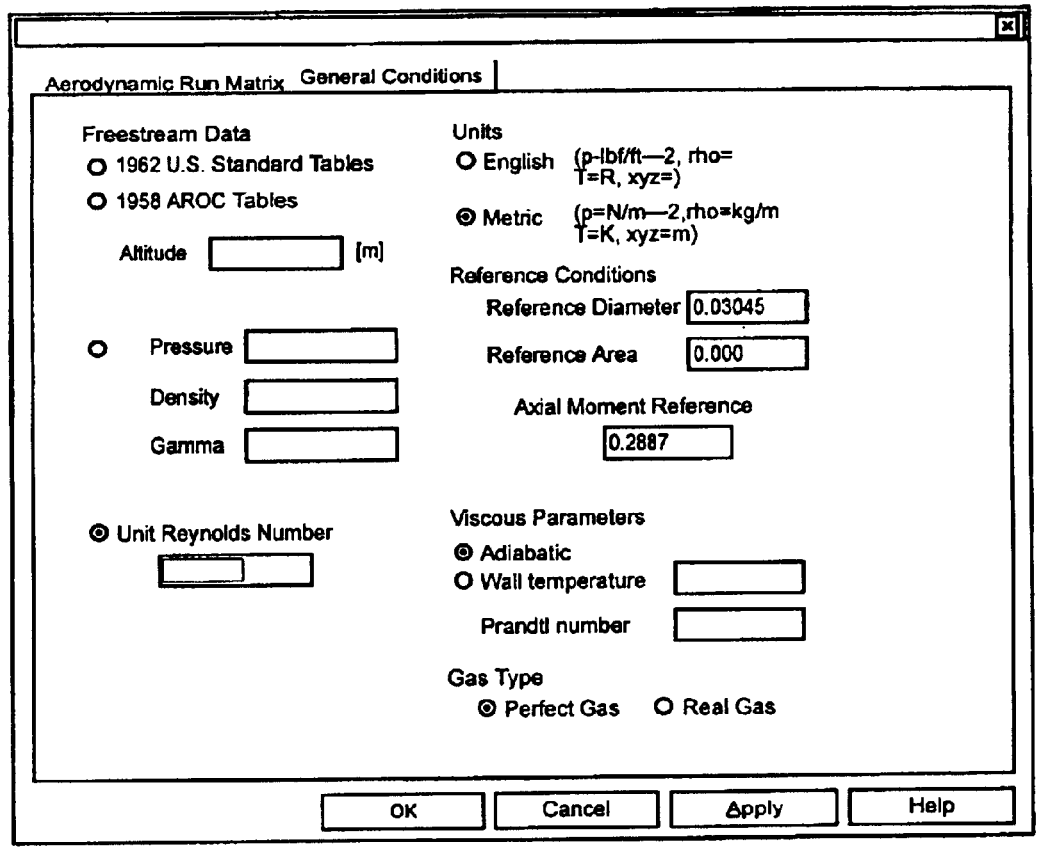

It will also be appreciated that a number of general aerodynamic parameters must be specified before executing either the Euler or boundary layer solvers. These parameters, which are listed in the dialog box of FIG. 17*b*, include:

Free-stream Data—The required free-stream data includes the pressure, density, and ratio of specific heats (g).

Units—Specify either English or metric units. It must be noted that all of the parameters entered must be in base units (i.e., meters, not centimeters; feet, not inches, . . . etc.). Incorrect results will be obtained if the user enters all of the lengths in centimeters and then tries to compensate by entering the reference quantities in meters. Although entering non-standard units will not effect the inviscid solution, it will produce incorrect results for the viscous solution due the to Reynolds number effect.

Reference Conditions—Enter the reference diameter (typically the base diameter) and the reference area (typically the area calculated using the base of the missile). Also, specify the axial location about which the pitching and yawing moments are calculated (The rolling moment is always taken about the missile centerline). It should be mentioned here that a nose down pitching moment is negative.

Viscous Parameters—If the viscous boundary layer code is to be considered then the wall boundary condition for the heat flux and the Prandtl number must be specified. For the adiabatic wall, calculating an appropriate wall temperature using the recovery factor methodology imposes a zero heat flux boundary condition.

Gas Type—Select either a perfect gas or a real gas solution. It will be noted that when 'real gas' is selected, then the approximate Riemann solver must be selected during performance of subroutine 320, which is discussed immediately below.

It should be mentioned at this point that there are three methods of specifying the free stream data. The first method is to select either of the standard atmospheric tables (1962 U.S. Standard Tables or 1959 AFDC Tables) and then enter an altitude in the provided field of the dialog box. The pressure and density will be calculated from the standard table data and the ratio of specified heats is assumed that of standard air (1.4). The second method is to specify the pressure, density, and ratio of specific heats (gamma) directly by clicking on the radio button next to these parameters and entering the desired values. The third method is to specify a unit Reynolds number using the equation present immediately below, and let the Zeus$^{++}$ code tool calculate the corresponding pressure and density. Gamma, the ratio of specific heats, is taken to be that of standard air (1.4).

$$Re_L = \frac{\rho_\infty U_\infty}{\mu_\infty}$$

Figure 18:
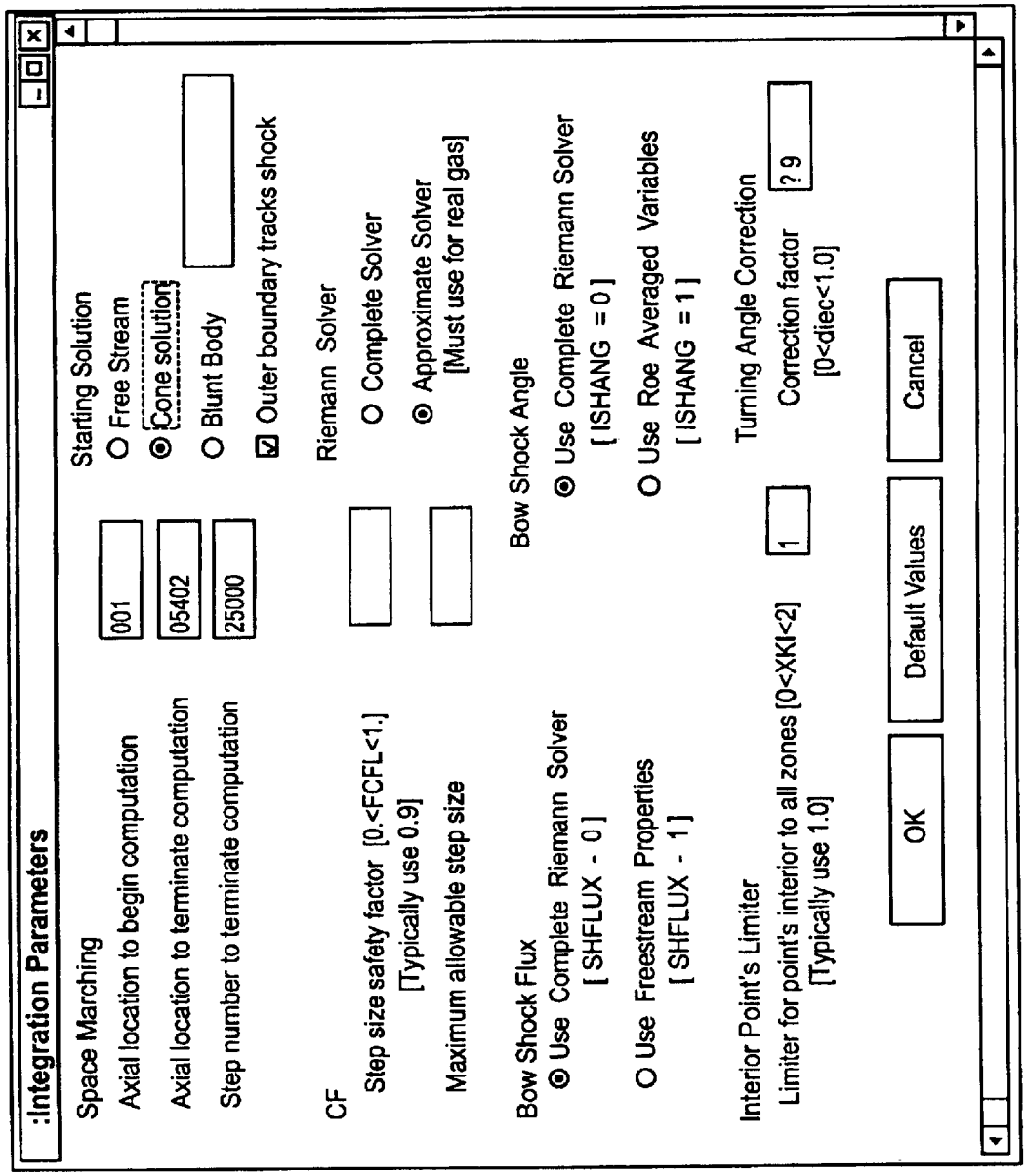
FIG. 18 is a screen capture of an Integration Parameters dialog box produced by Zeus++ code tool.

A number of user specified integration parameters are then specified during subroutine 320. These parameters, which describe axial limits for integration, starting solution, stability criterion, limiters, and flux calculation parameters, are entered into the dialog box depicted in FIG. 18 and include:

Space Marching—Enter the starting and final axial locations for the solution. Also, enter a maximum number of steps to take before the code aborts. It will be noted that the starting axial location is dependent on the type of starting solution applied, as discussed in detail below.

Stability Criterion—Enter a step size safety factor (analogous to a CFL number) between zero and unity. Also, specify a maximum allowable step size to ensure that all relevant features are spatially resolved in the axial direction.

Starting Solution—The Euler solver is a marching code and, therefore, a starting solution must be specified on the missile before the integration can proceed. Three different types of starting solutions are available, as follows:

(1) Free-Stream—A free-stream profile is specified as the starting solution at the axial location entered in the 'space Marching' section. For this type of inflow profile, the outer boundary does not track the conical shock, but rather, is user specified in terms of body radii during subroutine 210. It should be mentioned that the region upstream of this profile is ignored. Therefore, in order to accurately compute the forces and moments, the integration should begin as close to the nose as is numerically possible.

(2) Cone Solution—The cone starting solution applies a one-dimensional cone solver to the region from the nose to the beginning axial location specified in the space marching section. This calculates the shock angle, as well as the flowfield directly aft of the shock, given the local turning angle. The starting profile is then taken to be that generated by the conical solver. In other words, a conical flow solver is applied from the nose tip to the location specified as the 'Axial Location to begin computation'. The Euler solver then begins integration at this location with the profile supplied by the conical flow solver. Advantageously, the conical flow solver is intended to provide the shock angle as well as the flowfield properties directly aft of the shock. It is not intended to solve the flowfield for the entire nose cone. The one-dimensional cone solver cannot calculate the forces/moments, and therefore, if the user does not start the Euler solver until the end of the nose section, the forces/moments due to this section will be neglected. In other words, the conical solver should only be applied to a very small region around the nose tip and not to the entire nose section. It should be mentioned at this point that when the local turning angle becomes excessively large, the one-dimensional cone solver will compute a subsonic Mach number aft of the shockwave. The Zeus Euler solver is a space marching code, and therefore, cannot handle subsonic regions. For this case, a free-stream starting solution must be applied.

(3) Blunt Body—For a blunt body, the flow will be subsonic in some region surrounding the nose section. If the user attempts to begin the Zeus integration too close to the nose, the code will encounter a subsonic region and abort. To prevent this, a blunt body solver must be applied to the entire subsonic region. This solver provides a solution from the beginning of the nose to the value specified in the space marching section labeled 'Axial location to begin computation'. The user must ensure that this value is downstream of the entire subsonic region. It should be mentioned that, in contrast to the free-stream and conical starting profiles, the blunt body solver calculates the forces and moments in the region between the nose and the starting location for the Euler solver. These forces and moments are summed with the values obtained by the Euler solver to provide the total forces/moments acting on the body. Thus, for this starting procedure, it is acceptable to run the blunt body solver over the entire nose section.

Riemann Solver—Specify whether the full Riemann or approximate Riemann solver is applied.

Bow Shock Flux—Calculate the numerical flux at the bow shock using either the complete Riemann solver or freestream properties.

Bow Shock Angle—Calculate the bow shock angle using either the complete Riemann solver or the Roe averaged variables.

Interior Point Limiter—Numerical limiter at all interior points (i.e., not adjacent to a surface). The default value is unity, however, this can be increased/decreased to modify the numerical damping provided by the integration scheme. The applicable range is 2 to 0, where 2 and 0 are the least and most dissipative, respectively. A value of zero reduces the integration scheme to a first-order Gudonov method. It should be mentioned that decreasing the damping (i.e., increasing the limiter value above) will improve the accuracy of the numerical scheme and will more accurately capture the flow-field discontinuities. Insufficient damping can often times lead to numerical oscillations in the flowfield and prevent a stable integration.

Turning Angle Correction—If a subsonic region is encountered while turning the flow the Zeus code will apply a limiter known as a turning angle correction. The actual turning angle encountered in the flow is multiplied by the turning angle correction to try to prevent a subsonic region. If this correction does not prevent a subsonic region then the code will abort. Typically, a value of 0.9 (i.e., 90% of the original angle) is applied.

Figure 19:
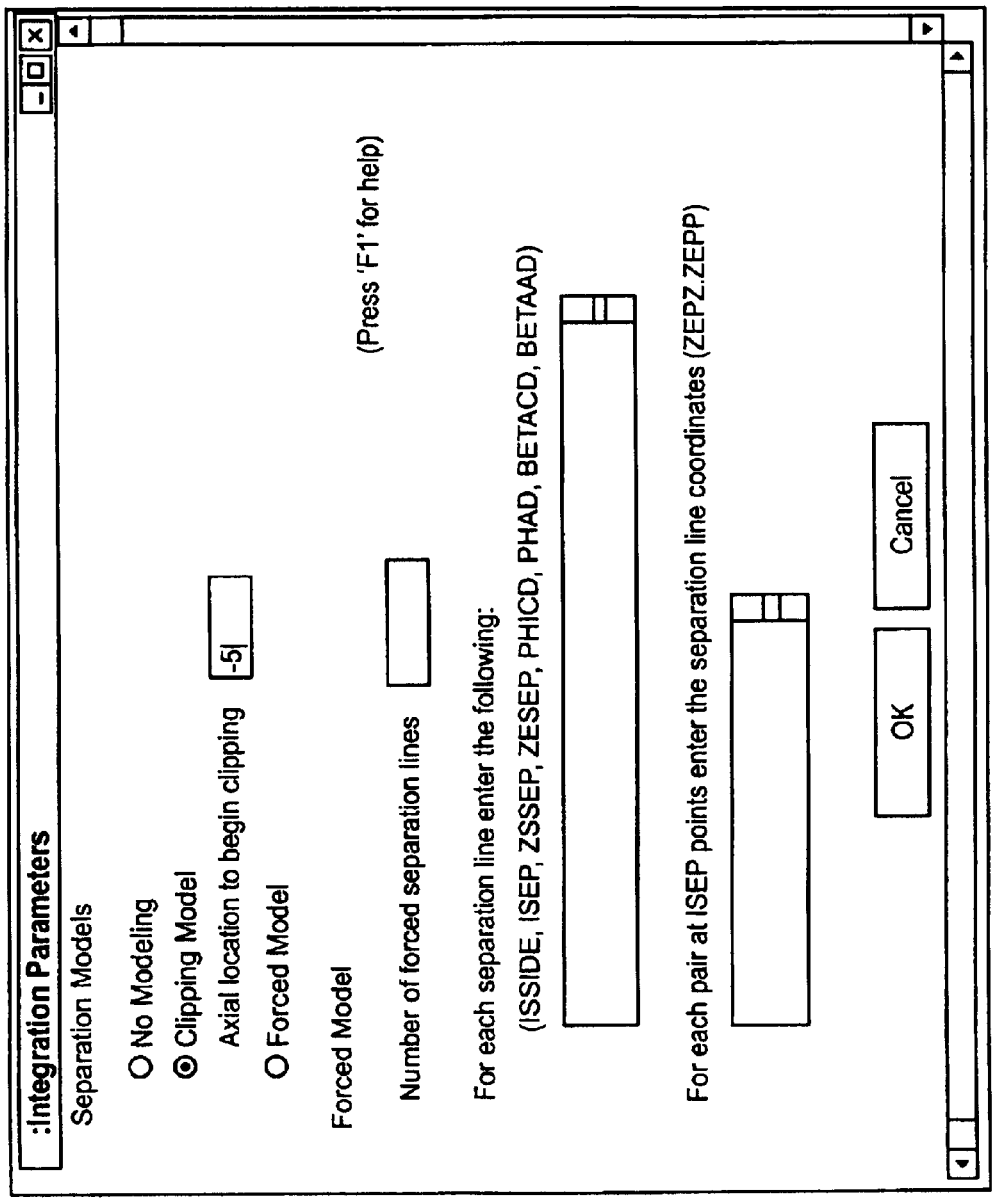
FIG. 19 is a screen capture of an Integration Modeling Parameters dialog box produced by Zeus++ code tool.

As previously mentioned, Zeus code is an inviscid solver, and as such, neglects the effects of viscosity on the flowfield. Since flow separation is a viscous phenomenon, an Euler solver alone cannot accurately predict the effects of a separation zone on the flowfield. Two separation models (clipping and forced) are available in the Zeus Euler solver of the Zeus$^{++}$ code tool which improves the predictive capabilities of the tool near separation zones. See FIG. 19.

The clipping separation model, which is described in detail in the document by Baltakis, F. P., Wardlaw, A. B., and Allen, J. M., entitled "Leeside Crossflow Modeling in Euler Space Marching Computations," (NSTC TR 86-342, November 1986), operates by decreasing the crossflow velocity on and near the body surface. The crossflow velocity reduction is accomplished by setting an upper limit to the allowable crossflow velocity. If the velocity at any point exceeds this value, it is reduced to this level. Pressure and density are assumed unchanged and the axial component of velocity is increased to give the correct stagnation enthalpy value. Clipping destroys the crossflow shock and produces a large vortex on the leeside of the body that is in qualitative agreement with experiment. Computed pressures on the leeside of the body are in better agreement with experiment. However, clipping tends to increase the windward pressures and often decreases the accuracy of the results in this region.

The forced separation model, which was originally described in this form by Kwong, C. M. and Myring, D. F., in their paper entitled "Fusiform Body Separation Flow Field Calculations using Euler and Boundary Layer Methods" (Royal Aeronautics Society Conference on the Prediction and Exploitation of Separated Flows, Paper No. 27, April 1989), seeks to simulate separation by altering the velocity direction along a user defined separation line. In each crossflow plane, the separation model is applied to wall cells "s" and "s+1", which are immediately windward and leeward of the separation line, respectively. Pressure and density at these points are defined by:

$$p_s = 0.5(p'_s-1 + p'_s+1)$$

$$p_s = 0.5(p'_s-1 + p'_s+1)$$

$$p_{s\ +1} = 0.5(p'_s + p'_s+2)$$

$$p_{s+1} = 0.5(p'_s + p'_s+2)$$

Here '$_s$ denotes old values. The flow velocities are determined by prescribing a streamline direction and assuming constant stagnation enthalpy. Unfortunately, solutions obtained with the forced separation model are sensitive to mesh size. As the mesh is refined, the pressure beneath the vortex diminishes.

Parameters which advantageously can be specified by the user for separation modeling include:

Separation Model—Select the desired separation model.

Clipping Separation—Enter the axial location to begin clipping.

Forced Separation—Enter the number of forced separation lines. For each of the lines, the user must specify the following parameters:

ISIDE—The side of the body on which the separation occurs. Zero if separation occurs between 0° and 180°, unity if separation occurs between 180° and 360°.

ISEP—The number of points used to define the separation line.

ZSSEP—Zeta value at which separation is started.

ZESEP—Zeta value at which separation is terminated.

PHICD, PHIAD, BETACD, BETAD—Flow direction in degrees. Typical values are 20°, 20°, 20°, 5°, respectively.

ZEPZ, ZEPP—A list of ISEP pairs of separation line coordinates where ZEPZ and ZEPP are the z and j coordinates for each point.

Figure 20:
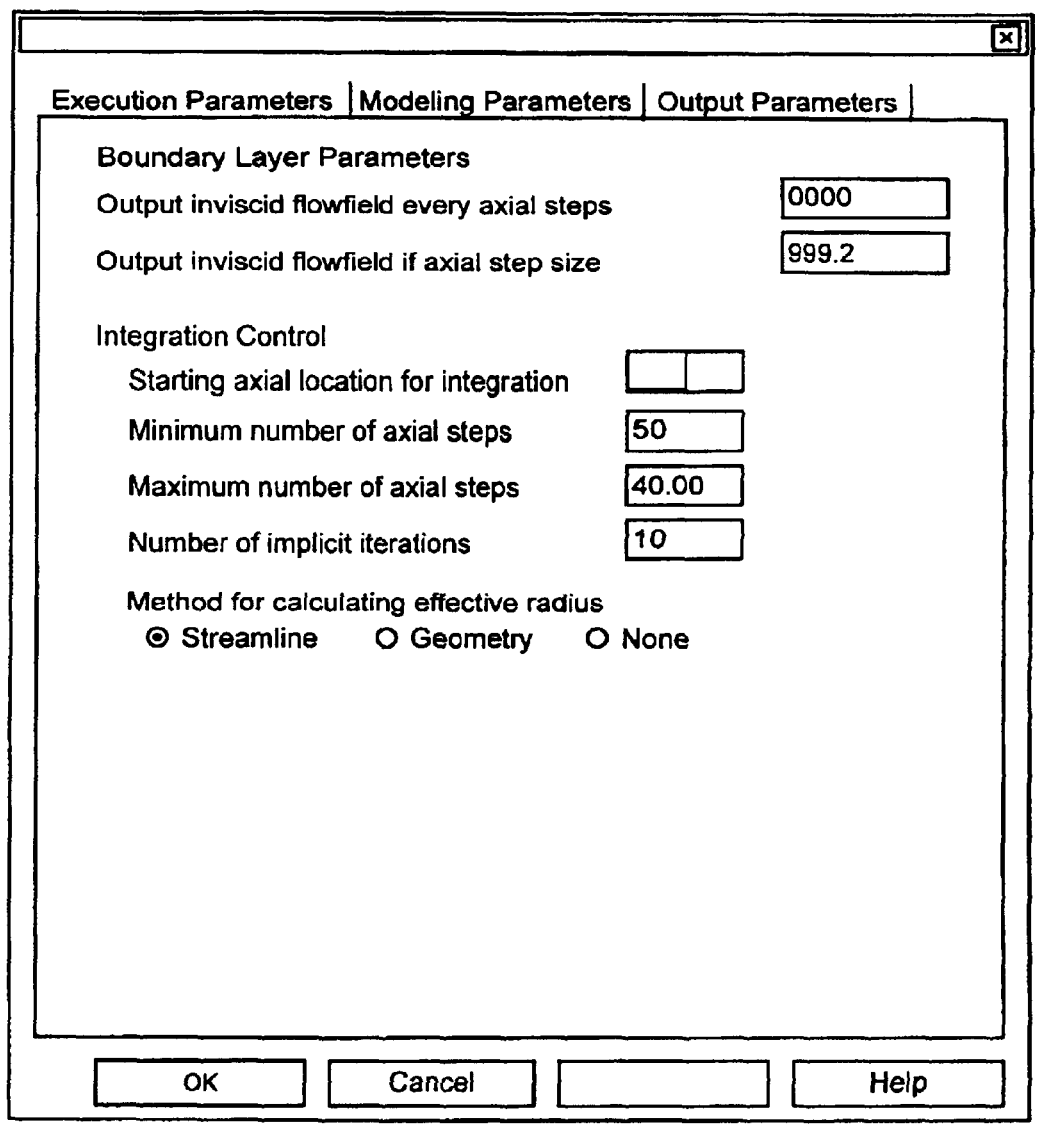
FIG. 20 is a screen capture of a Boundary Layer Execution Parameters dialog box produced by Zeus++ code tool.

It should be mentioned at this point that the boundary layer code requires, as a boundary condition, the inviscid solution from the Zeus code. Therefore, before executing the boundary layer code, the Zeus$^{++}$ code tool must save the inviscid solution at a number of different axial stations. While it is both unnecessary and infeasible (due to computational constraints) to save the inviscid flowfield at every axial station, an adequate number of axial stations must be considered in order to accurately solve the boundary layer equations. The user must save the inviscid solution often enough to resolve all relevant geometric features axially (i.e., must have several axial stations written out on each control surface). The user does this during subroutine 340 by specifying the following parameters and enter these selections in the dialog box illustrated in FIG. 20.

Output Inviscid Flowfield—Enter the increment and the axial stepsize for saving the inviscid flowfield. The Zeus code will save the inviscid flowfield every incremental axial step as well as every time the axial stepsize exceeds the specified value. It will be noted that the Zeus$^{++}$ code must save the inviscid flowfield often enough to axially resolve all relevant geometric features.

Starting Axial Location for Integration—Enter the axial location to begin the boundary layer solver. Note that this must lie downstream of the starting location of the Euler solver as specified in the Integration Parameters discussed with respect to subroutine 320.

Minimum Number of Steps—Enter the minimum number of axial steps the boundary layer solver will take. The code uses this parameter to calculate a maximum allowable stepsize.

Maximum Number of Steps—Enter the maximum number of axial steps the boundary layer solver will take before aborting.

Implicit Iterations—Number of implicit iterations.

Effective Radius—This parameter selects the manner in which the effective radius is calculated; the method by which streamline spreading is determined. The "streamline" option uses the distance between successive streamlines, the "geometry" option computes the local surface radius, while "none" sets the radius to unity. Optimal results are obtained with the "streamline" option except on circular bodies at zero incidence. Here the "geometry" option is recommended.

Figure 21:
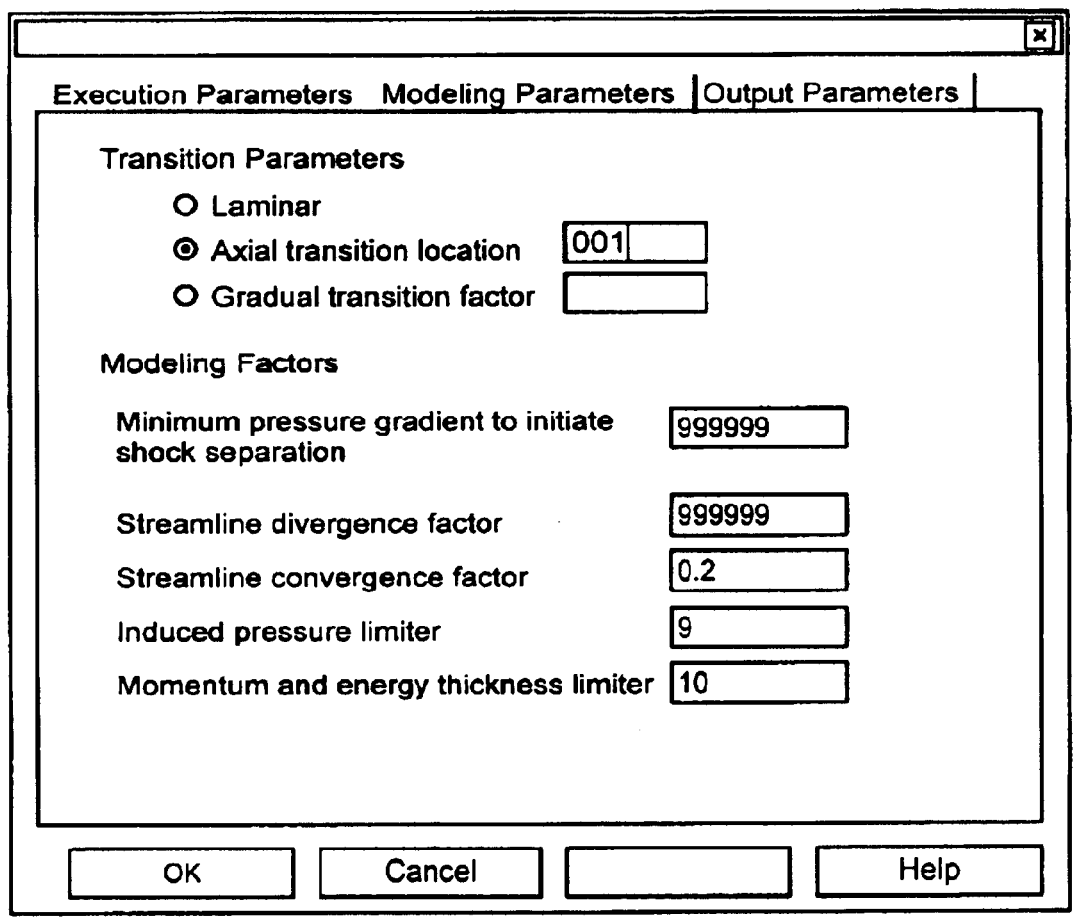
FIG. 21 is a screen capture of a Boundary Layers Modeling Parameters dialog box produced by Zeus++ code tool.

Referring again to FIG. 1, the boundary layer modeling parameters advantageously can also be selected by the user during subroutine 340. It will be appreciated that these selection will be applied to the Zeus$^{++}$ code tool by entering the selections in the dialog box illustrated in FIG. 21. These parameters include:

Transition Parameters—Select one of the three possible transition parameters. If laminar is selected then the flow is forced to remain laminar for the entire calculation. If an 'Axial transition location' is specified, the flow is laminar up to this point and then abruptly transitions to turbulent flow. If the 'Gradual transition factor' is selected, then the transition model is taken from the paper by Wardlaw, A. B. and Baltakis, F. P., entitled "An Integral Boundary Layer Procedure for Tactical Missiles" (AIAA 92-1026, Aerospace Design Conference, Irvine, Calif., February 1992), and the parameter specified is $F_1$ (default of 1.0) from Eq. 23 of that paper.

Pressure Gradient for Separation—If the streamwise pressure gradient exceeds this user specified parameter the boundary layer and energy thicknesses are reduced to simulate separation.

Streamline Divergence—Controls streamline divergence as described in the Wardlaw et al. paper referenced above ($K_d$ from Eq. 32). Set to unity to follow inviscid streamlines. Use a value of 2.0 for bodies at incidence. Only applies to edge #1 of each zone.

Streamline Convergence—Controls streamline convergence as described in the Wardlaw et al. paper referenced above ($K_c$ from Eq. 32). Set to unity to follow inviscid streamlines. Use a value of 0.2 for bodies at incidence. Only applies to edge #1 of each zone.

Induced Pressure Limiter—The boundary layer code attempts to correct for the induced pressure effects caused by the formation of the boundary layer. To prevent large pressure corrections around leading/trailing edges, the induced pressure is limited using the 'Induced pressure limiter' as discussed in the Wardlaw et al. paper referenced above ($K_f$ in section 4.3).

Momentum/Energy Thickness Limiter—A parameter which limits the momentum/energy thickness in anticipated regions of separation. The limiter is discussed in the Wardlaw et al. paper referenced above (k from Eq. 33).

Figure 22:
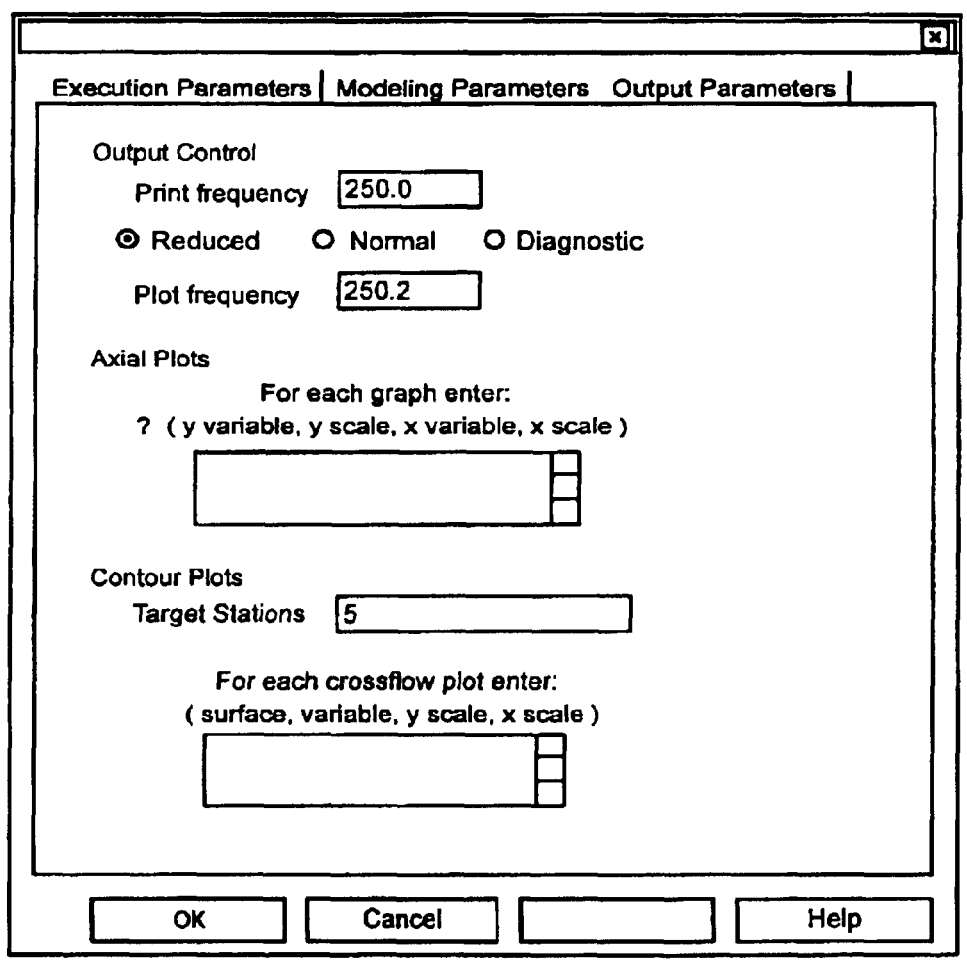
FIG. 22 is a screen capture of a Boundary Layer Output Parameters dialog box produced by Zeus++ code tool.

Having completed subroutine 330, the user then selects boundary layer output controls in subroutine 340 by completing the dialog box illustrated in FIG. 22. These parameters are discussed in greater detail below.

Print Frequency—The ASCII output table, 'ZeusBL.out' is generated every 'print frequency' steps. The 'reduced/normal/diagnostic' option controls the amount of data written to the output tape. "Reduced" prints only the most important quantities such as $C_f$ and $C_h$. "Normal" includes additional boundary layer parameters as well as edge conditions.

Plot Frequency—The contour plot tape is written every "plot frequency" steps.

Axial Plots—Specify the surface number, point location, dependent and independent variables, as well as x/y scaling factors. Each of the axial plots will be written to a file 'graphxxx', where 'xxx' is the number of the axial plot.

i—surface number j—point number

Y variable—Select one of the following for a dependent variable:

1. pressure
2. density
3. edge velocity
4. temperature
5. $C_f$ (base on edge conditions)
6. $C_f$ (base on reference conditions)
7. $C_h$ (base on edge conditions)
8. $C_h$ (base on reference conditions)
9. Momentum thickness 10. Displacement thickness
11. Energy thickness
12. Heating rate (B/(ft^2 sec), J/(m^2 sec))
13. Viscous loads; Here "i" is the surface number and 'j' is the load (1=x force, 2=y force, 3=z force, 4=x moment, 5=y moment, 6=z moment). To get total body viscous loads set "i" to 0.
14. Induced loads. Same options apply as for viscous loads.

Y scale—Dependent variable scale factor.

X variable—Select one of the following for an independent variable:
1. Axial location, z
2. Reynolds number (based on axial location), $Re_z$
3. Streamline length, s
4. Reynolds number (based on streamline length), $Re_s$ X scale—Independent variable scale factor.

Contour Plots—Specify a list of target stations (separated by blank spaces) where the contour plots are desired (the files are written to 'graphcxxx', where 'xxx' refers to the appropriate contour file number). Then list the following parameters for each contour plot:

Surface—Enter the surface number. The surface numbers are counted sequentially along each of the four edges for each zone (i.e., Zone 2, Edge3 corresponds to surface number 7).

Variable—Select one of the following for a dependent variable:
1. pressure
2. density
3. edge velocity
4. temperature
5. $C_f$ (base on edge conditions)
6. $C_f$ (base on reference conditions)
7. $C_h$ (base on edge conditions)
8. $C_h$ (base on reference conditions)
9. Momentum thickness
10. Displacement thickness
11. Energy thickness
12. Heating rate (B/(ft^2 sec), J/(m^2 sec))

Y-scale—Dependent variable scale factor.

X-scale—Crossflow variable scale factor.

Figure 23:
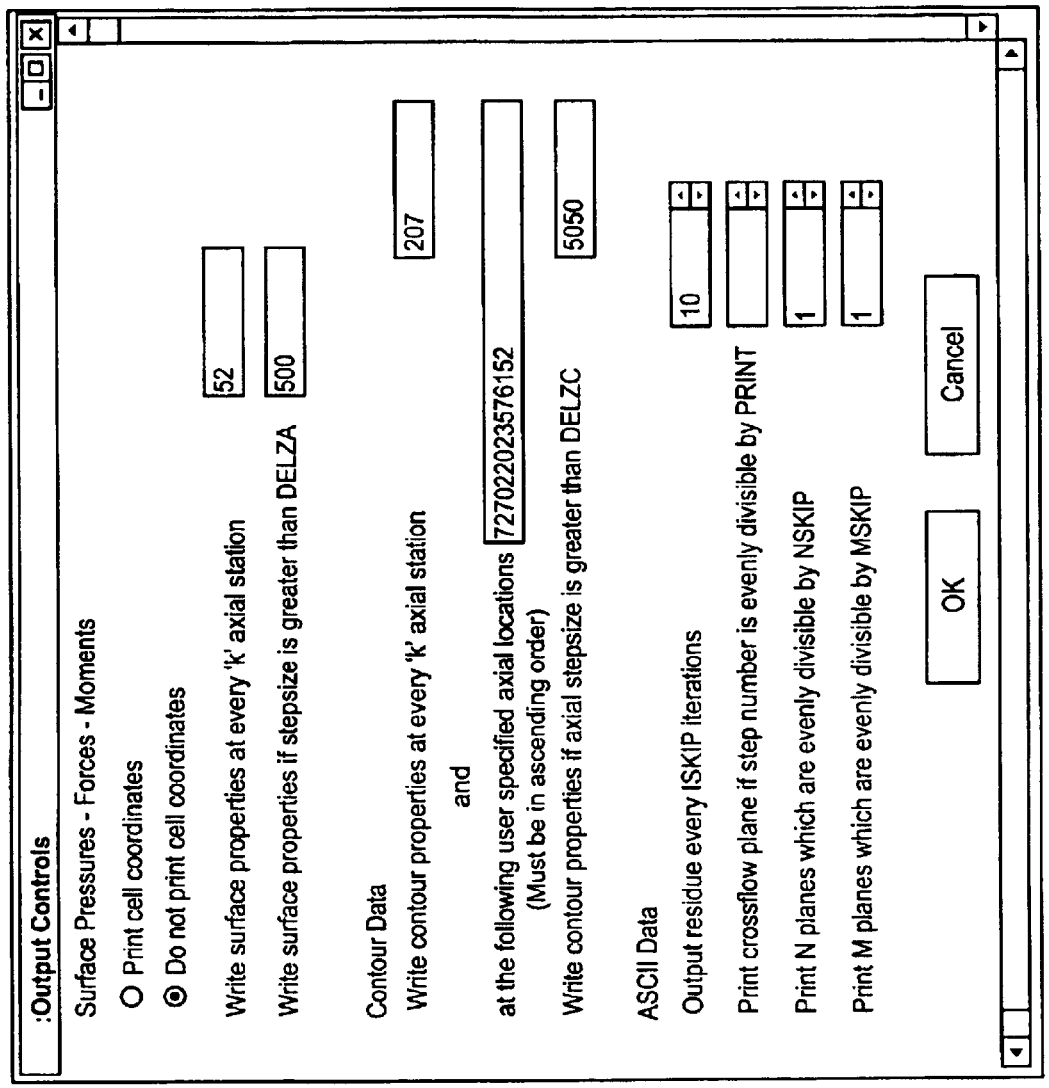
FIG. 23 is a screen capture of an overall Output Parameters dialog box produced by Zeus++ code tool.

Finally, during subroutine 350, the output controls for the output of the boundary layer solver are specified and entered into appropriate sections of the dialog box illustrated in FIG. 23. Data entered during this step controls which type of output the Zeus Euler solver generates, as well as the output frequency. The first section in FIG. 23 controls the output for the surface pressures, forces, moments, and centers of pressure. The second section controls the output for generating contour plots of the flowfield variables. The final section controls both the ASCII output and screen residual.

The output control parameters include:

Surface Pressures, Forces, and Moments—This section handles the output for the surface pressure, forces, and moments.

Print Cell Coordinates—Write the cell coordinates (axial and radial location) at each cell where the data is written along with the surface pressure, forces, moments, and centers of pressure.

Write Surface Properties—Specify both an incremental value and a maximum stepsize for generating the output data. The Zeus++ code writes the output at every specified incremental value (axially) as well as if the axial stepsize is larger than the specified parameter.

Contour Data—Contour plots of a variety of flowfield parameters (pressure, density, Mach number, etc . . . ) can be generated at various axial stations.

'k' Axial Stations—Enter the increment for generating the contour plot output data. The code will write the output data at every user specified incremental axial station.

User Defined Stations—Specify the specific axial locations where the contour data is desired. This is useful for generating contour plots at specific locations in the flowfield (i.e., leading/trailing edges of control surfaces).

Given Stepsize—The Zeus++ code generates a contour plot file every time the axial stepsize is greater than the specified value.

ASCII Data—The ASCII data is written to the 'fort.9' data file in the 'filename' directory.

Output Residual—Specify the axial step increment for writing out the residual data. Note, the code writes the residual data to the screen as well as to the 'fort.9' data file.

Crossflow Plane—Specify the axial increment for saving the ASCII data from a crossflow plane (i.e., an axial station).

Print 'M', 'N' Planes—Specify the radial and circumferential increments for saving the ASCII crossflow plane data (i.e., Write out the data at every 'm' radial points and 'n' circumferential points). The computational effort required for I/O can be minimized by not writing out every radial and circumferential data point.

Figure 24:
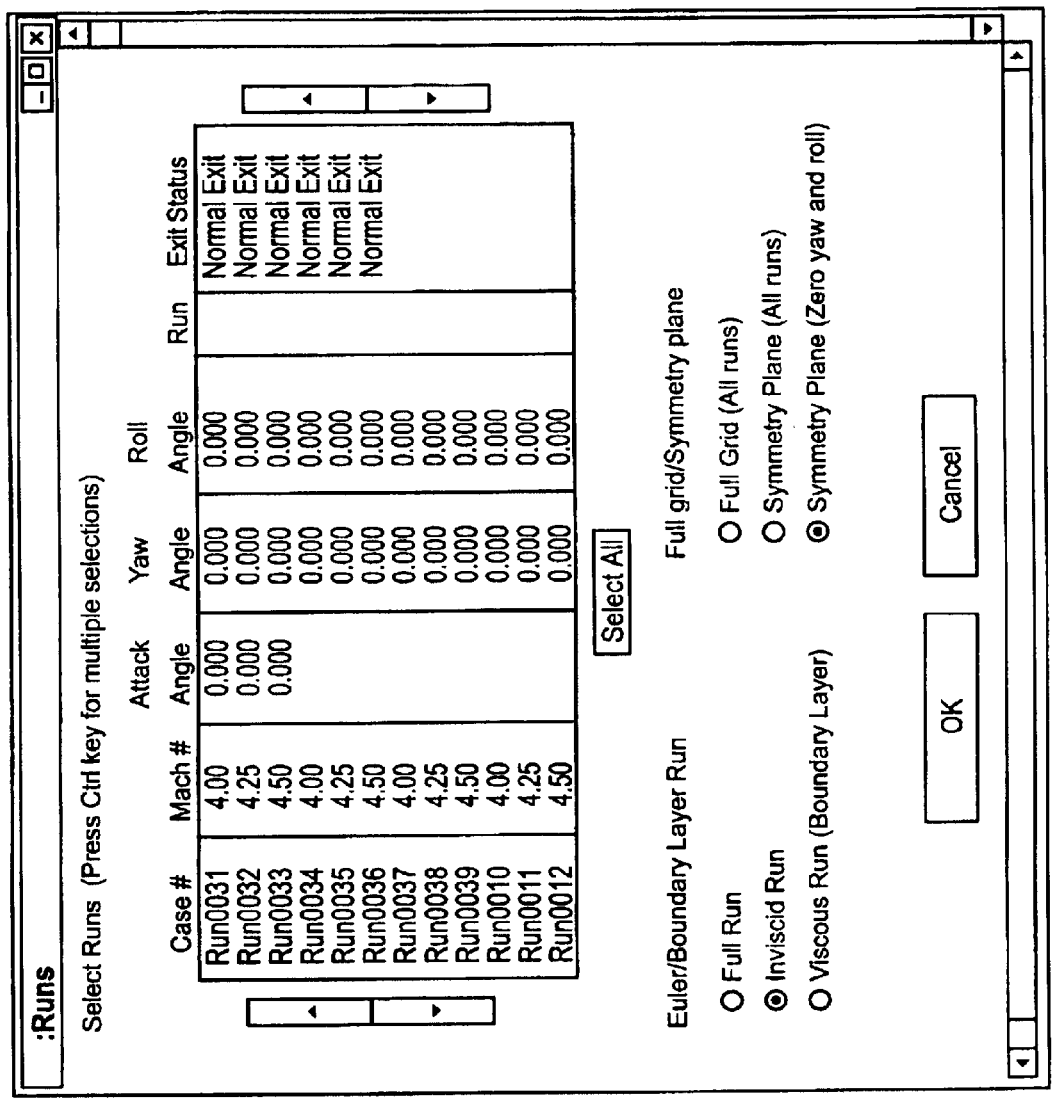
FIG. 24 is a screen capture of a dialog box for specifying the 'runs' employed by Zeus++ code tool.

Once the routine 300 has been completed, the user is ready to select which cases are to be evaluated as well as what type of solution is performed during routine 400. A step by step procedure for executing a run is provided below, along with a sample view of the execution screen illustrated in FIG. 24.

(1) Select the desired run(s). It should be mentioned that multiple runs advantageously may be selected in a number of ways. The first is to hold down the 'Ctrl' key and click on each of the desired runs. Alternatively, the user can click on the first desired run, hold down the 'shift' key, and then click on the last desired run to thereby select all cases in-between. Finally, the user can simply click on the 'select All' button to run all available cases.

(2) Select the type of run desired. Here it must be noted that if 'Full Run' is selected, the code will execute the Inviscid Euler solver, write out the flowfield at the axial intervals specified with respect to Boundary Layer Execution Parameters, which were discussed in relation to FIG. 20, and then execute the boundary layer solver to get an approximate viscous solution. If 'Inviscid Run' is selected, the code will execute the Inviscid Euler solver and then terminate; no viscous approximation will be calculated. If a viscous calculation is desired, the user must click on the 'Viscous Run' button in FIG. 24, and select the desired case. Only the runs that have been solved with the inviscid solver will show up as choices when the 'Viscous Run' button is selected. This is because the viscous boundary layer solver requires the inviscid flowfield as a boundary condition.

(3) Specify whether a symmetry plane exists. If the user has a priori knowledge that the geometry is non-symmetric about the pitch plane, the user must select 'Full Grid (All Runs)'. If the geometry is symmetric about the pitch plane choose either 'symmetry Plane (All Runs)' when the user will not be running any asymmetric cases, or alternatively, choose 'symmetry Plane (Zero Roll and Yaw)' to run a symmetry plane only for those cases with zero yaw and roll angles. If a symmetry plane is being considered, then only half of the computational domain (180 vs. 360 degrees) is considered. It will be appreciated that running with a symmetry plane asserted will cut the computational time approximately in half.

(4) Click on 'OK' to perform the desired calculations.

(5) After the runs have completed, revisit the 'Execution' section to check on the termination status of each run. If the 'Runs' column contains one asterisk (*) then the inviscid solution has completed (e.g., Run0001). If it contains double asterisks (**) then both the inviscid and viscous solutions have been completed (Run0002). In addition, the 'Exit Status' column should contain 'Normal Exit' if no runtime errors were encountered. If the code did not exit normally then an error code will be provided. These error codes are 5000 series numbers for the Euler solver, 6000 series numbers for the boundary layer solver, 7000 series numbers for the cone solver, and 8000 series numbers for the blunt body solver. A description of each of the possible error codes is presented in FIGS. 29a through 29d.

As the Euler solver included in the Zeus$^{++}$ code tool according to the present invention is executing, a variety of information is written to a command prompt, as illustrated in FIG. 25a. This includes messages denoting which code is currently running (cone, blunt body, or Euler solver) as well as a number of parameters denoting the status of the run. The output written to the command prompt for the inviscid solver includes the following parameters:

Starting Profile—Denotes which type of starting solution is employed (freestream, cone, or blunt body). This parameter was specified during performance of subroutine 320.

Step—Counter for the number of axial steps taken. The frequency with which the screen data is written is controlled by the Output Residual parameter specified in subroutine 350.

Zeta—Axial location of the current integration step.

dzeta—Local axial stepsize. This value changes as the solution proceeds downstream and is controlled by the stability criterion specified during performance of subroutine 320. If the axial stepsize is too large to resolve the geometric features then the maximum allowable stepsize can be adjusted in the Integration control section.

nCFL, mCFL—The radial and circumferential index for the maximum residual.

Exit Status—Upon termination the exit status of the current run is displayed along with any error messages that occurred during the Euler solution. 'Normal Stop' is displayed if no runtime errors were encountered. It should be noted that after the run has completed the window will display 'Press Any Key' to continue. When a key is depressed, the command window is deleted and control is returned to the Zeus$^{++}$ GUI window. Whether or not the window pauses after completion is controlled by the 'Pause After Each Run' parameter, which was set during the performance of routine 100.

Moreover, the viscous boundary layer solver in the Zeus$^{++}$ code tool according to the present invention outputs text to the command prompt, as illustrated in FIG. 25b. The test includes the following parameters:

Case Description—During each run the case number being executed is displayed (Runxxxx) along with the appropriate heat flux boundary condition at the surface (i.e., Adiabatic or Isothermal). The boundary condition is specified during performance of subroutine 210.

Step—Counter for the number of axial steps taken. The frequency with which the screen data is written is controlled by the Output Residual parameter specified during the performance of subroutine 350.

Zeta—Axial location of the current integration step.

Exit Status—Upon termination the exit status of the current run is displayed along with any error messages that occurred during the Euler solution. 'Normal Stop' is displayed if no runtime errors were encountered. It should be mentioned at this point that when the run has been completed, the window illustrated in FIG. 25b will display 'Press Any Key' to continue. When a key is depressed, the command window is deleted and control is returned to the Zeus$^{++}$ graphical user interface window. Whether or not the window pauses after completion is controlled by the 'Pause After Each Run' parameter during performance of routine 100.

The Zeus$^{++}$ code tool includes a built-in post-processor for viewing the solution data during performance of routine 500. A variety of methods of examining the results are available including ASCII representations of the data during subroutine 510, as well as plots of a wide variety of parameters, all of which are discussed in detail below. The plotting features of the Zeus$^{++}$ code make use of the Tecplot plotting package, which has been discussed several times before. It should be mentioned that the Zeus$^{++}$ code tool advantageously can be used if Tecplot is not installed on the users' machine. Thus, while the plotting capabilities of the post-processor will not be functional, ASCII representations of the data will still be available.

The 'PostProcessor' routine 500 includes the subroutines outlined in Table III, which subroutines, in an exemplary case, are not performed in parallel.

TABLE III

| Subroutine 510 | ASCII Forces/Moments | Examine an ASCII data file of the forces/moments and centers of pressure acting on the body. |
|---|---|---|
| Subroutine 520 | Single Run Plots | Generate line plots of the surface pressures, forces, and moments, vector and streamline plots, and contour plots of a variety of flowfield parameters (Mach number, density, temperature, etc.). |
| Subroutine 530 | Multi-Run Plots | Generate comparative line plots of forces/moments versus a variety of independent variables (Mach number, angle of attack, yaw angle, and roll orientation). |

Figure 26:
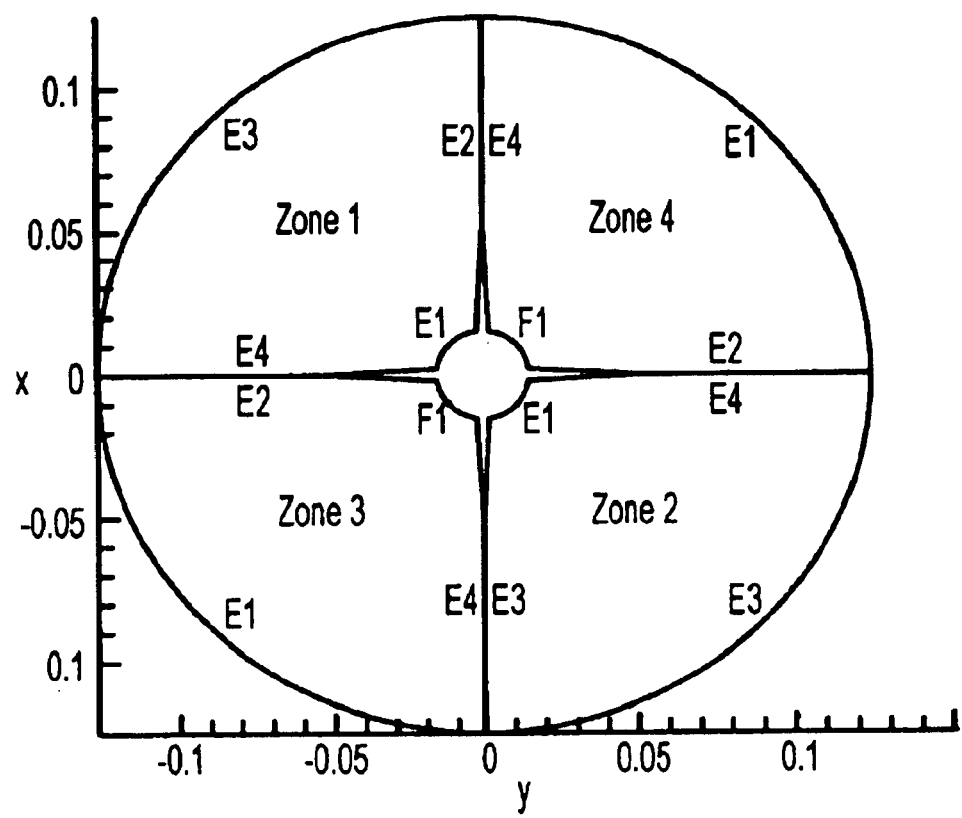
FIG. 26 is a screen capture of the force/moment output produced by Zeus++ code tool.
Figure 27:
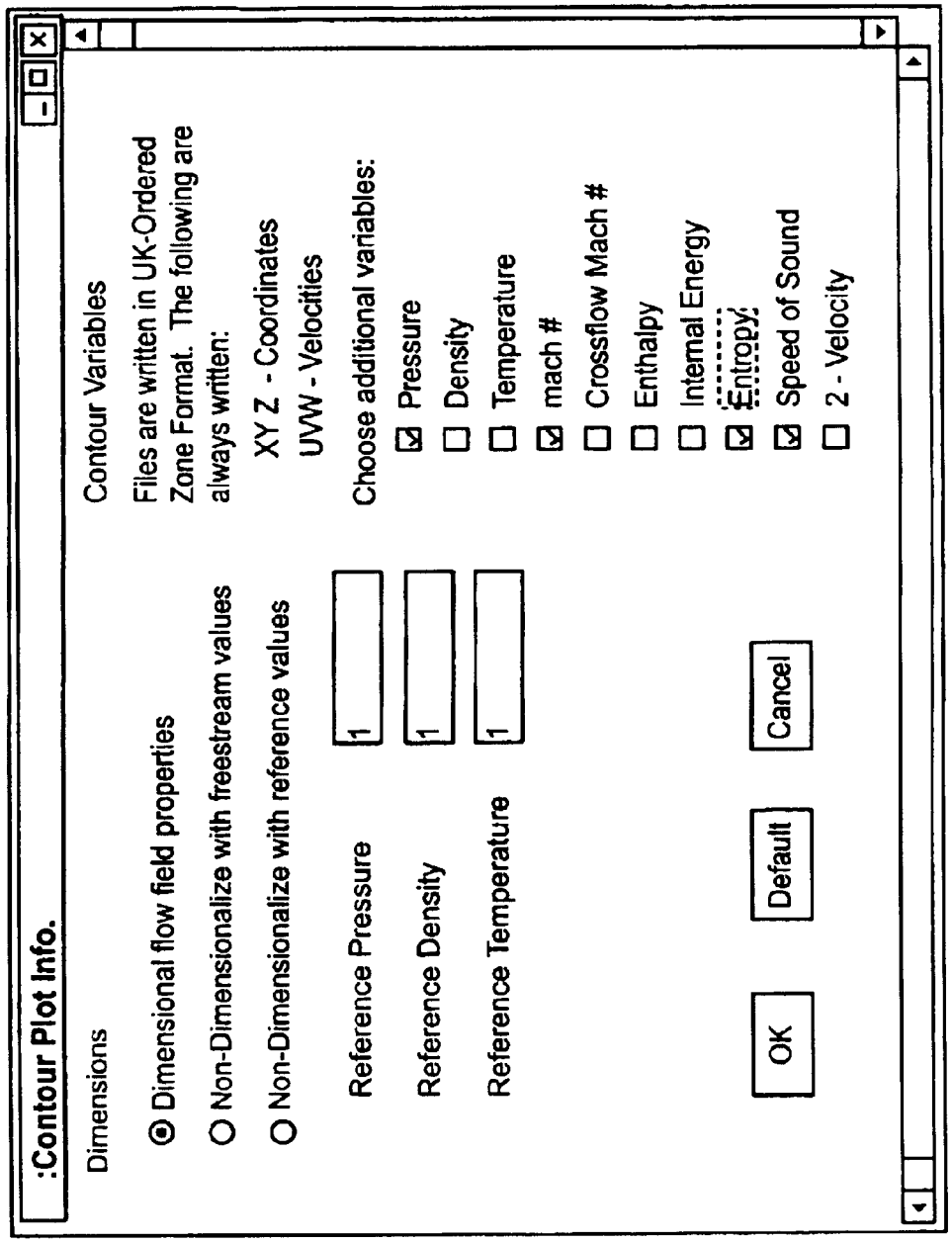
FIG. 27 is a screen capture of a Contour Plot Information dialog box produced by Zeus++ code tool.

With respect to subroutine 510, it will be appreciated that there are two options when examining the forces, moments, and centers of pressure for a given set of runs. The first is to view the totals or the sum from each of the zone edges. This gives the sum of the values from the missile surface and the control surfaces, or the total acting on the geometry. The second option prints the forces/moments separately on each edge of each zone. This is often useful if the values on a particular control surface are desired (i.e., force due to 1 fin). It will be recalled from the discussion above that edge$_1$ refers to the missile surface, edge$_2$ and edge$_3$ refer to the zonal boundaries (i.e., the control surfaces, if they exist), and edge$_4$ refers to the outer boundary, as illustrated in FIG. 26.

For each case run, the ASCII output file, 'ForcesMoments.txt,' advantageously will contain the following data:

(1) Mach #
(2) Angle of Attack
(3) Angle of Yaw
(4) Roll Angle
(5) Normal, Side, and Axial Force
(6) Yaw, Pitch, and Roll Moments
(7) $X_{cp}/L_{Ref}$ and $Y_{cp}/L_{Ref}$ (centers of pressure)

It should be mentioned at this point that an approximate value for the axial force due to the base (i.e., base drag) is calculated using the methodology outlined by Moore, F. G. and Hymer, T. in the paper entitled "Improved Empirical Model for Base Drag Prediction on Missile Configurations Based on New Wind Tunnel Data, (NSWC-DD TR 92-509, October 1992). Moreover, it will be noted that the corrections due to angle of attack and fin thickness have been omitted. Also, note that the base drag calculation requires the ratio of the base area to the reference area ($A_{base}/A_{ref}$). The Zeus++ code tool calculates the base area assuming a circular cross-section, and therefore, if a non-circular cross-sectional geometry is applied, the resultant base drag must be multiplied by the factor ($A_{base}/A_{cir}$). In other words, an equivalent circular base area must be applied.

When both the inviscid and viscous solutions have been performed, the output for the forces/moments will be listed component wise. In other words, the inviscid, viscous, and induced contributions will be listed along with the totals.

During subroutine 520 of the post-processor routine 500, a single run plot is employed to examine the output data for a single run. The 'single Run Plots' permits the user to generated a selected on of three plots as outlined in Table IV. To make a comparative analysis of different runs, see the discussion of subroutine 530 regarding Multi-Run Plots.

TABLE IV

| | |
|---|---|
| Surface Pressures | Line plot of the surface pressures. |
| Forces and Moments | Line plots of the forces, moments, and centers of pressure. |
| Contour/Vector Plots | Vector and streamline plots. Contour plots of a variety of flowfield parameters (Mach number, density, temperature, . . . etc.). |

The first option, 'Plot Surface Pressure', advantageously displays a graph of the surface pressure versus axial distance for zone edges 1, 2, and 4 (see FIG. 26). Preferably, the pressures are listed for each circumferential plane on the missile surface and for each radial plane on the zone edges (i.e., control surfaces). Each plane is labeled as 'Plane #x, Zone #y, Edge #z'. If the Edge number is '1' then the Plane # refers to the circumferential index. If the Edge number is '2' or '4' then the Plane # refers to the radial index.

The second single-run plotting option, 'Plot Forces & Moments', advantageously plots either the total force/moment or the edge force/moment as a function of axial location. The totals versus edge values are described with respect to FIG. 26. The 'x', 'y', 'z' coordinates refer to normal, side, and axial components, respectively.

Finally, the third option., i.e., Contour/Vector Plots, permits generation of contour plots for a variety of flowfield variables for a given run. The user's selections are entered via the Contour Plot Info dialog box. The user clicks on 'Choose Plot Attributes' to bring up this dialog box and specifies the plotting attributes. Select the dimensions and the variables desired for the contour plot. It will be noted that the coordinates (x, y, z) and the velocities (u, v, w) are always written to the contour plot file. After the plot information has been specified, click 'OK' to accept the values. Then select 'Plot Data' to generate the contour plots.

Figure 28:
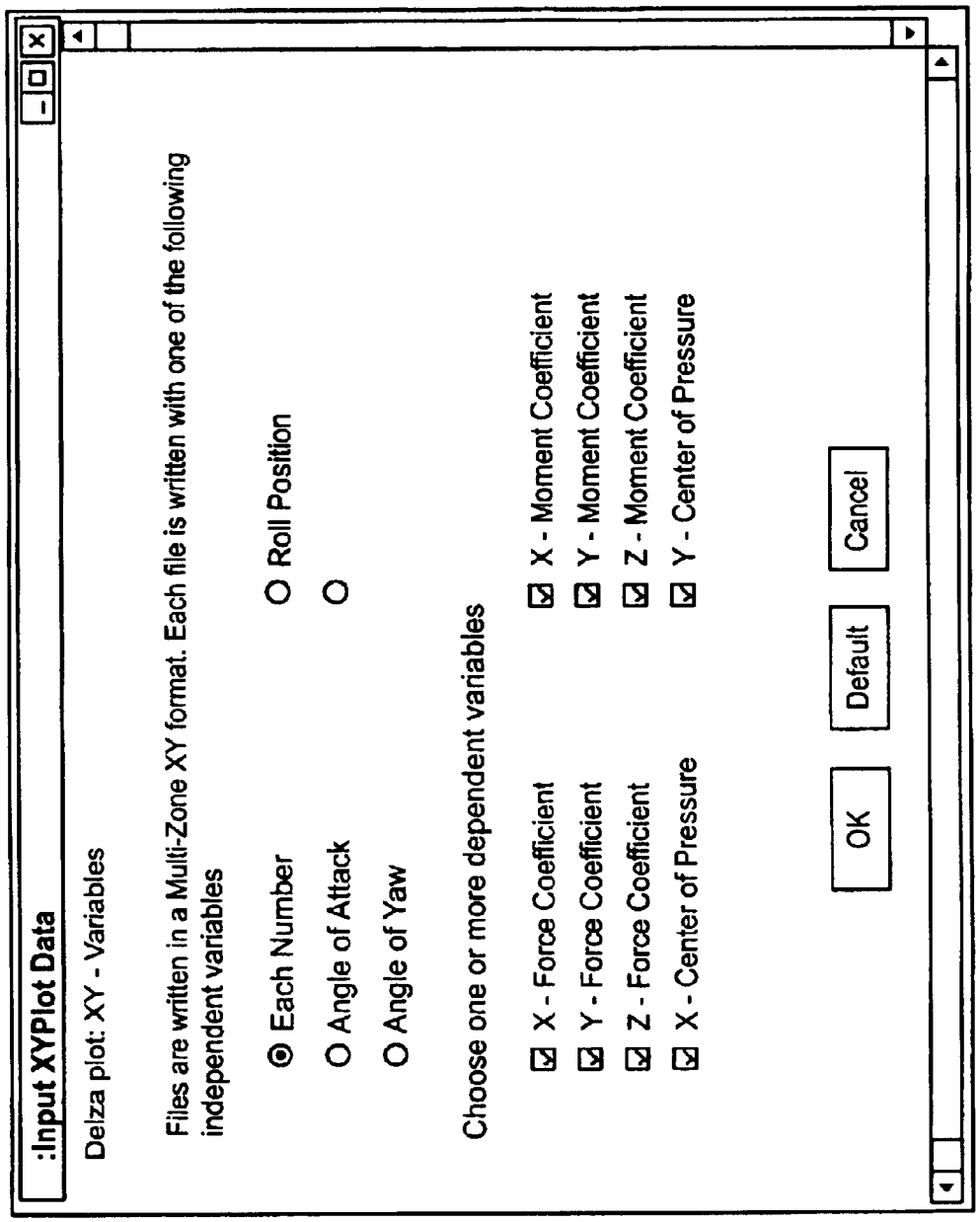
FIG. 28 is a screen capture of an Input XY Plot Data dialog box produced by Zeus++ code tool.

During subroutine 530, the post-processor of the Zeus++ code tool according to the present invention is used to compare the effect of Mach number, angle of attack, yaw angle, and roll orientation on the forces, moments, and centers of pressure of a given geometry. The user selects the desired independent variable as well as the desired dependent variables using the dialog box depicted in FIG. 28. Clicking on 'OK' generates a plot for all of the completed runs.

During subroutine 540, a check is performed to determine whether post-processing has been completed. If the answer is affirmative, the Zeus++ code routine ends at routine 600. If the answer is negative, the user repeats one of subroutines 510, 520 or 530 to conduct further post-processing operations.

Figure 30:
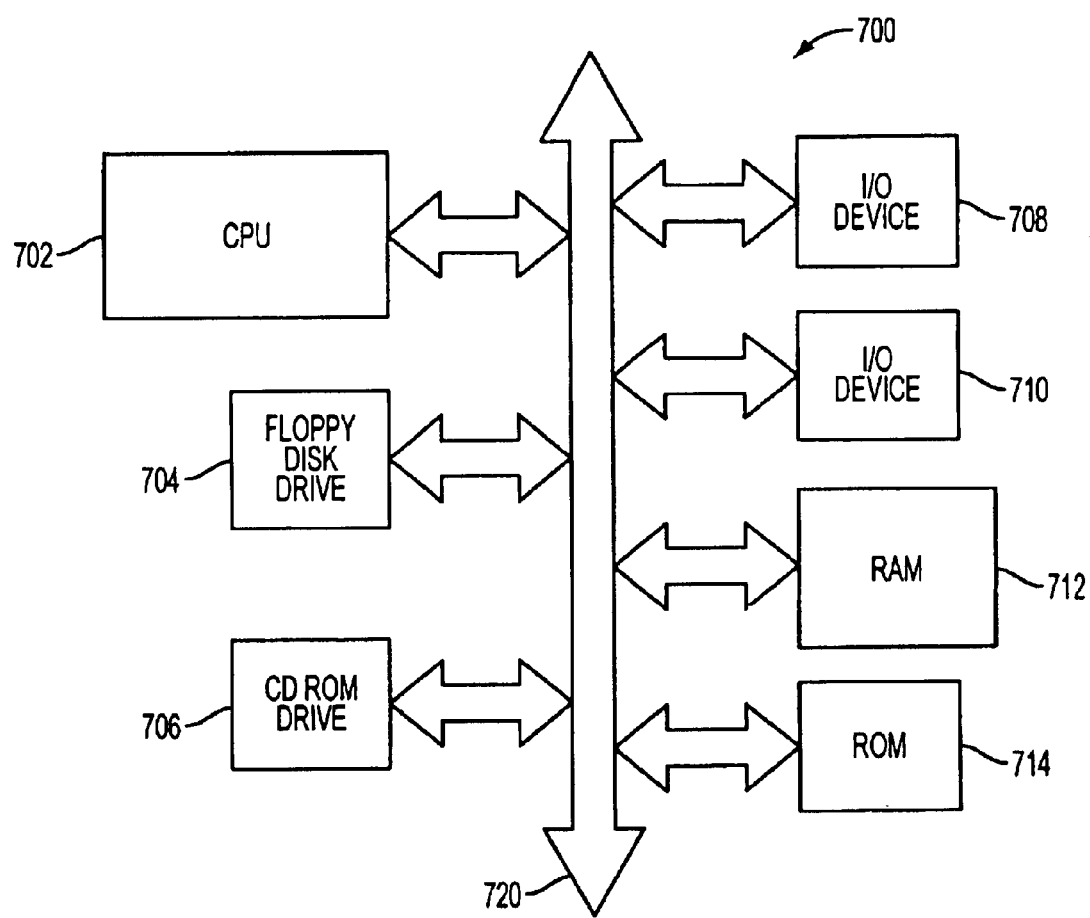
FIG. 30 is a high level block diagram of a general purpose computer which advantageously can be converted to a specific purpose computer by execution of the Zeus++ code.

FIG. 30 is a block diagram of a processor-based system 700, which advantageously may be a computer system, a process control system or any other system employing a processor and associated memory. The system 700 includes a central processing unit (CPU) 702, e.g., a microprocessor, that communicates with a RAM 712 and an I/O device 708 over a bus 720. It must be noted that the bus 720 may be a series of buses and bridges commonly used in a processor-base system, but for convenience purposes only, the bus 720 has been illustrated as a single bus. A second I/O device 710 is illustrated, but is not necessary to practice the invention. The processor-based system 700 also includes read-only memory (ROM) 714, and may include peripheral devices such as a disk drive 704, e.g., a floppy disk drive or a hard disk drive, and a compact disk (CD) ROM drive 705 that also communicates with the CPU 702 over the bus 720, as is well known in the art. The Zeus++ code tool is designed generate the GUI on this general purpose computer system and convert the general purpose computer into a special purpose computer instantiating Euler and boundary layer solvers.

The Zeus++ software tool and corresponding program according to the present invention significantly reduce both the costs and turnaround time associated with CFD solutions of missile type geometries with arbitrary control surfaces. The software tool advantageously goes a long way toward taming the ZEUS flowfield solver, which is a supersonic space marching Euler solver capable of computing both internal and external flowfields. The software tool modifies the ZEUS code to make it more amenable to solving for the forces/moments on missile type geometries with arbitrary control surfaces. In particular, the modifications made to the ZEUS code focused on the following four primary areas of improvement:

(1) Minimize the Required Training—This was done by developing a graphical user interface, modifying the grid generation capabilities, and developing simple to use pre- and post-processing features. The GUI allows for most of the complexity of the code to be hidden from the user. Instead of developing Fortran modules to specify the missile and control surface geometries, the current tool (Zeus++) uses a series of point-and-click GUI menus to setup the required geometry files. All of the complexities of generating a three-dimensional grid and blending control surfaces to the missile have been hidden from the user. The GUI interface also significantly simplifies the post-processing of the results.

(2) Reduce the Setup/Execution Time—The interface reduces the setup time required to a few minutes vs.

many hours/days for the original ZEUS code. In addition, the user can setup the code to sweep through a variety of parameters (Mach number, angle of attack, angle of yaw, and roll angle) by simply specifying an initial, final, and incremental value for each of the parameters. All of the complexity involved with generating numerous input files has been hidden from the user. This feature allows for parametric type studies with no additional setup time required.

(3). Minimize the Costs Associated with Computational Fluid Dynamic Solutions—These are often prohibitively high and, therefore, prevent the application of CFD during the design/analysis phase of missile development. The two primary influences on these costs are personal and computational requirements. The personal costs are inflated because the user must have extensive training in performing a very time consuming task. Zeus$^{++}$ reduces the personnel costs by minimizing the required training and reducing the time required to setup a run. The second factor, computational cost, is high because the ZEUS code was developed for use on expensive Unix workstations. These costs were reduced by porting the ZEUS code to less expensive personal computers and by developing a GUI that runs under a widely available operating system (Windows NT and Windows 95).

(4) Extend the Range of Applications for the Code—There are a number of cases where either the ZEUS code cannot be applied, or where the results may be suspect due to the approximate nature of the solution procedure (space marching Euler). For these cases, the Zeus$^{++}$ tool includes a grid generator which will output a three-dimensional grid and the appropriate boundary conditions which can then be applied as input for the GASP[1] full Navier-Stokes flowfield solver. It should be noted that generation of complex three-dimensional missile grids with control surfaces often took days to develop. The Zeus$^{++}$ tool reduces this to a matter of minutes on a personal computer.

As mentioned above, the Zeus$^{++}$ code tool and corresponding program according to the present invention includes a fluids solver and serves a grid generator. Advantageously, this permits the generation of a Euler grid, which can be used for solution with the integral Zeus Euler and boundary layer solvers, and a Navier-Stokes (NS) grid. The Zeus$^{++}$ code tool exports the NS grid and all of the required input files necessary for a GASP run. It will be appreciated that the Zeus$^{++}$ code tool advantageously can be adapted to generate the grids needed for other CDF solvers. Moreover, the post-processor module makes use of the Tecplot plotting package, which permits the user to generate movies depicting the flowfield around a missile. In addition, the grid generator in the Zeus$^{++}$ code tool provides a point-and-click interface with a number of pre-defined missile geometries incorporated therein. Thus, a variety of cross-sectional geometries can be applied, along with cross-section blending, e.g., blending a circular nose cone into an elliptic forebody.

The Zeus$^{++}$code tool solves both the Euler equation (inviscid solution using the Zeus code) and the viscous boundary layer equations. It will be appreciated that the inviscid output from the Zeus code is used as a boundary condition to a viscous boundary layer solver, which permits the computation of viscous effects, i.e., wall heating rates, turbulent effects, viscous drag, etc. The Zeus$^{++}$ code tool permits the user to set the parameters for multiple runs in order to simplify parametric type studies. The user simply specifies the initial, final, and incremental parameter of interest, i.e., Mach number, angle of attack, yaw angle, roll angle, etc., and the Zeus$^{++}$ code tool runs all possible variants for that missile geometry and parameter set.

The Zeus$^{++}$ codetool was developed for use on a personal computer under Windows 95, 98 and NT. It will be appreciated that development of the GUI for use in Windows significantly reduces the costs associated with performing these types of calculations; the GUI eliminates the need for expensive Unix workstations.

Finally, it should be mentioned that all of the documents and papers mentioned above are incorporated herein by reference for all purpose. In addition, the attached Appendix includes the applicable code for the Zeus$^{++}$ code tool.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. Computer readable instructions for converting a general purpose computer into a specialized computer for simulation testing a vehicle in an environment by presenting a graphic user interface (GUI) facilitating selection of the vehicle and definition of the environment before generating selected ones of a Euler grid and a Navier-Stokes grid from a single set of predetermined parameters, wherein the computer readable instructions further comprise:

a memory for storing a plurality of pre-defined vehicle assemblies, each of the vehicle assemblies corresponding to a pre-processed point field geometry on the surface of a vehicle to be tested;

a first software module for using said GUI to select among the plurality of pre-defined vehicle assemblies to be tested;

a second software module for defining the environment in which to perform the test;

a third software module for generating a set of predetermined parameters using the pre-processed point field geometry on the surface of a vehicle to be tested selected by the GUI in the first software module and using the environment defined in the second software module;

a fourth software module for generating the selected ones of the Euler grid and the Navier-Stokes grid; and a fifth software module for post-processing the output of the third software module.

2. The computer readable instructions as recited in claim 1, wherein the pre-processed point field geometry on the surface of a vehicle to be tested stored in the memory and selected among the plurality of vehicle assemblies using said GUI in said first software module define the geometry of the vehicle to be tested and the control surfaces associated with the vehicle to be tested.

3. The computer readable instructions as recited in claim 2, wherein the first software module implements a further step for viewing a computational domain associated with the Navier-Stokes grid.

4. The computer readable instructions as recited in claim 1, wherein the second software module implements steps for:

defining aerodynamic parameters;

specifying integration control parameters;

defining separation modeling parameters;

specifying boundary layer control parameters; and defining output control parameters.

5. The computer readable instructions as recited in claim 1, wherein the third software module generates at least one of a Euler solver, a flowfield solver, and the Navier-Stoked grid generator.

6. The computer readable instructions as recited in claim 1, wherein the fifth Software module implements at least one step for:

viewing ASCII data;

generating single run plots; and generating multi-run plots.

7. The computer readable instructions as recited in claim 6, wherein the viewing step comprises viewing an ASCII listing of force/moments and centers of pressure action on the vehicle.

8. The computer readable instructions as recited in claim 6, wherein the single run plot generating step comprises generating line plots of surface pressures, forces, and moments on the vehicle corresponding to a single run.

9. The computer readable instructions as recited in claim 6, wherein the multi-run plot generating step comprises generating comparative line plots of forces/moments with respect to at least one of Mach number, angle of attack, yaw angle, and roll orientation on a vehicle corresponding to a plurality of parametric runs.

10. A method for simulation testing a vehicle in an environment by presenting a graphic user interface (GUI) facilitating selection of the vehicle and definition of the environment before generation of selected ones of a Euler grid and a Navier-Stokes grid from a single set of predetermined parameters, said method comprising:

(a) storing a plurality of pre-defined vehicle assemblies, each of the vehicle assemblies corresponding to a pre-processed point field geometry on the surface of a vehicle to be tested;

(b) after said step (a), using said GUI to select among the plurality of pre-defined vehicle assemblies to be tested, (c) using said GUI to define the environment in which to perform the simulation test;

(d) generating a set of predetermined parameters using the pre-processed point field geometry on the surface of a vehicle to be tested selected in said step (b) and using the environment defined in said step (c);

(e) generating the selected ones of the Euler grid and the Navier-Stokes grid responsive the set of predetermined; and (f) post-processing the output of step (e).

11. The method as recited in claim 10, wherein the pre-processed point field geometry on the surface of a vehicle to be tested stored in step (a) and selected among the plurality of pre-defined vehicle assemblies using said GUI in said step (b) define the geometry of the vehicle to be tested and the control surfaces associated with the vehicle to be tested.

12. The method as recited in claim 11, further comprising a step for:

(h) viewing a computational domain associated with the Navier-Stokes grid.

13. The method as recited in claim 10, wherein said step (c) of defining the environment in which to perform the simulation test further comprises:

(i) defining aerodynamic parameters;

(j) specifying integration control parameters;

(k) defining separation modeling parameters;

(l) specifying boundary layer control parameters; and (m) defining output control parameters.

14. The method as recited in claim 10, wherein step (c) further comprises:

(n) generating at least one of a Euler solver, a flowfield solver, and the Navier-Stoked grid generator.

15. The method as recited in claim 10, wherein the post-processing of said step (f) implements at least one step for:

(o) viewing ASCII data;

(p) generating single run plots; and (q) generating multi-run plots.

16. The method as recited in claim 15, wherein step (o) further comprises viewing an ASCII listing of force/moments and centers of pressure action on the vehicle.

17. The method as recited in claim 15, wherein step (p) further comprises generating line plots of surface pressures, forces, and moments on the vehicle corresponding to a single run.

18. The method as recited in claim 15, wherein step (q) further comprises generating comparative line plots of forces/moments with respect to at least one of Mach number, angle of attack, yaw angle, and roll orientation on a vehicle corresponding to a plurality of parametric runs.

19. A storage medium for storing the computer readable instructions of claim 1.

* * * * *